United States Patent
Keisling et al.

(10) Patent No.: US 11,602,074 B2
(45) Date of Patent: Mar. 7, 2023

(54) SYSTEMS AND ASSEMBLIES FOR COOLING SERVER RACKS

(71) Applicant: Inertech IP LLC, Plano, TX (US)

(72) Inventors: Earl Keisling, Ridgefield, CT (US);
John Costakis, Glasco, NY (US);
Gerald McDonnell, Spring Hill, FL (US); Michael Welch, Ridgefield, CT (US)

(73) Assignee: INERTECH IP LLC, Plano, TX (US)

( * ) Notice: Subject to any disclaimer, the term of this patent is extended or adjusted under 35 U.S.C. 154(b) by 0 days.

(21) Appl. No.: 16/653,509

(22) Filed: Oct. 15, 2019

(65) Prior Publication Data

US 2020/0163250 A1    May 21, 2020

Related U.S. Application Data

(63) Continuation of application No. 15/590,596, filed on May 9, 2017, now Pat. No. 10,448,539, which is a (Continued)

(51) Int. Cl.
*H05K 7/20*   (2006.01)
*H05K 5/02*   (2006.01)

(52) U.S. Cl.
CPC .......... *H05K 7/20218* (2013.01); *H05K 5/02* (2013.01); *H05K 7/2079* (2013.01); (Continued)

(58) Field of Classification Search
CPC ................................................ H05K 7/20745
See application file for complete search history.

(56) References Cited

U.S. PATENT DOCUMENTS

| | | |
|---|---|---|
| 3,156,102 A | 11/1964 | Costantini et al. |
| 3,749,981 A | 7/1973 | Koltuniak et al. |

(Continued)

FOREIGN PATENT DOCUMENTS

| | | |
|---|---|---|
| WO | 2011163532 A2 | 12/2011 |
| WO | 2012118553 A2 | 9/2012 |

OTHER PUBLICATIONS

"Second Supplemental Declaration of John H. Bean Jr. and John Christopher Niemann under 37 C.F.R. § 1.131" (filed in U.S. Appl. No. 12/361,087), dated Jun. 7, 2011 (Year: 2011).*

*Primary Examiner* — Robert J Hoffberg
(74) *Attorney, Agent, or Firm* — Weber Rosselli & Cannon LLP

(57) ABSTRACT

A cooling assembly for cooling server racks includes a server rack enclosure sub-assembly that includes at least one panel member defining a volume for receiving one or more server racks having a front portion and a rear portion, at least one of the panel members is a rear panel member; at least one frame member defines an opening for receiving the rear portion of the server racks to form a hot space between the rear panel member and the combination of the frame member and the rear portion of the server racks; a cooling sub-assembly disposed in thermal communication with the hot space to cool at least one server supported in the server rack and including a chassis receiving at least one heat exchange member for exchanging heat between a refrigerant fluid flowing through the heat exchange member and fluid flowing through the hot space heated by the server.

11 Claims, 19 Drawing Sheets

Related U.S. Application Data continuation of application No. 14/216,005, filed on Mar. 17, 2014, now Pat. No. 9,648,784.

(60) Provisional application No. 61/802,267, filed on Mar. 15, 2013.

(52) U.S. Cl.
CPC ..... *H05K 7/20145* (2013.01); *H05K 7/20609* (2013.01); *H05K 7/20736* (2013.01); *H05K 7/20745* (2013.01); *H05K 7/20781* (2013.01)

(56) References Cited

U.S. PATENT DOCUMENTS

| | | | |
|---|---|---|---|
| 6,305,180 B1 | 10/2001 | Miller et al. | |
| 6,775,137 B2 | 8/2004 | Chu et al. | |
| 6,819,563 B1 | 11/2004 | Chu et al. | |
| 6,924,981 B2 | 8/2005 | Chu et al. | |
| 6,973,801 B1 | 12/2005 | Campbell et al. | |
| 7,033,267 B2 | 4/2006 | Rasmussen | |
| 7,104,081 B2 | 9/2006 | Chu et al. | |
| 7,318,322 B2 | 1/2008 | Ota et al. | |
| 7,342,789 B2 | 3/2008 | Hall et al. | |
| 7,397,661 B2 | 7/2008 | Campbell et al. | |
| 7,492,593 B2 | 2/2009 | Campbell et al. | |
| 7,507,912 B1 | 3/2009 | Sempliner et al. | |
| 7,508,663 B2 | 3/2009 | Coglitore | |
| 7,511,960 B2 | 3/2009 | Daniel et al. | |
| 7,534,167 B2 | 5/2009 | Day | |
| 7,599,184 B2 | 10/2009 | Upadhya et al. | |
| 7,656,660 B2 | 2/2010 | Hoeft et al. | |
| 7,660,109 B2 | 2/2010 | Iyengar et al. | |
| 7,688,578 B2 | 3/2010 | Mann et al. | |
| 7,746,634 B2 | 6/2010 | Hom et al. | |
| 7,791,882 B2 | 9/2010 | Chu et al. | |
| 7,800,900 B1 | 9/2010 | Noteboom et al. | |
| 7,841,199 B2 | 11/2010 | Vangilder et al. | |
| 7,854,652 B2 | 12/2010 | Yates et al. | |
| 7,905,106 B2 | 3/2011 | Attlesey | |
| 7,916,470 B2 | 3/2011 | Steven et al. | |
| 7,944,692 B2 | 5/2011 | Grantham et al. | |
| 7,990,709 B2 | 8/2011 | Campbell et al. | |
| 8,031,468 B2 | 10/2011 | Bean, Jr. et al. | |
| 8,081,459 B2 | 12/2011 | Doll et al. | |
| 8,141,621 B2 | 3/2012 | Campbell et al. | |
| 8,157,626 B2 | 4/2012 | Day | |
| 8,164,897 B2 | 4/2012 | Graybill et al. | |
| 8,174,829 B1 | 5/2012 | Rotheroe | |
| 8,184,435 B2 | 5/2012 | Bean, Jr. et al. | |
| 8,331,086 B1 | 12/2012 | Meissner | |
| 8,360,833 B2 | 1/2013 | Grantham | |
| 8,405,982 B2 | 3/2013 | Grantham et al. | |
| 8,462,496 B2 | 6/2013 | Schmitt et al. | |
| 8,520,387 B2 | 8/2013 | Chen et al. | |
| 8,628,154 B2 * | 1/2014 | Caveney | H05K 7/20745 312/198 |
| 8,628,158 B2 | 1/2014 | Caveney | |
| 8,708,164 B2 | 4/2014 | Borowsky et al. | |
| 8,733,812 B2 * | 5/2014 | Slessman | G06F 1/20 296/24.3 |
| 8,857,120 B2 | 10/2014 | Marrs et al. | |
| 8,867,204 B1 * | 10/2014 | Gardner | H05K 7/1497 361/679.46 |
| 8,917,502 B1 * | 12/2014 | Gardner | H05K 7/20745 361/679.46 |
| 8,934,242 B2 | 1/2015 | Bean, Jr. et al. | |
| 8,947,879 B2 * | 2/2015 | Broome | H05K 7/20745 361/696 |
| 9,016,696 B2 | 4/2015 | Borowsky et al. | |
| 9,060,450 B2 | 6/2015 | Scheidler | |
| 9,066,450 B2 | 6/2015 | Bednarcik et al. | |
| 9,072,193 B1 | 6/2015 | Eichelberg | |
| 9,192,074 B2 | 11/2015 | Shibata et al. | |
| 9,198,310 B2 | 11/2015 | Eichelberg et al. | |
| D744,996 S | 12/2015 | Keisling et al. | |
| 9,301,432 B2 | 3/2016 | Nelson et al. | |
| 9,313,927 B2 | 4/2016 | Krietzman | |
| 9,615,488 B1 | 4/2017 | Eichelberg | |
| 9,648,784 B2 | 5/2017 | Keisling et al. | |
| 9,772,610 B2 * | 9/2017 | Slessman | B31C 9/00 |
| 9,839,163 B2 | 12/2017 | Keisling et al. | |
| 9,867,318 B2 | 1/2018 | Eichelberg et al. | |
| 9,888,606 B1 | 2/2018 | Wendorf et al. | |
| 9,888,608 B2 | 2/2018 | Pons et al. | |
| 9,930,810 B2 | 3/2018 | Jiang et al. | |
| 10,114,353 B2 * | 10/2018 | Slessman | B31C 9/00 |
| 10,130,012 B2 | 11/2018 | Bednarcik et al. | |
| 10,448,539 B2 * | 10/2019 | Keisling | H05K 7/20609 |
| 10,716,241 B2 * | 7/2020 | Keisling | H05K 7/20745 |
| 11,015,824 B2 * | 5/2021 | Nguyen | H05K 7/20709 |
| 2010/0144265 A1 | 6/2010 | Bednarcik et al. | |
| 2010/0188816 A1 | 7/2010 | Bean, Jr. et al. | |
| 2010/0300648 A1 * | 12/2010 | Grantham | H05K 7/20745 165/55 |
| 2011/0205705 A1 | 8/2011 | Graybill et al. | |
| 2012/0012283 A1 | 1/2012 | Bean, Jr. et al. | |
| 2012/0112612 A1 | 5/2012 | Krietzman | |
| 2012/0281352 A1 | 11/2012 | Namek et al. | |
| 2012/0300391 A1 | 11/2012 | Keisling et al. | |
| 2013/0160271 A1 | 6/2013 | Krietzman et al. | |
| 2013/0161273 A1 | 6/2013 | Borowsky et al. | |
| 2013/0165035 A1 | 6/2013 | Krietzman et al. | |
| 2013/0300266 A1 | 11/2013 | Ramey et al. | |
| 2014/0196394 A1 | 7/2014 | Greeson et al. | |
| 2014/0224460 A1 * | 8/2014 | Means | F28D 1/05383 165/172 |
| 2014/0254089 A1 | 9/2014 | Eichelberg et al. | |
| 2015/0003009 A1 | 1/2015 | Moore et al. | |
| 2015/0195958 A1 | 7/2015 | Keisling et al. | |
| 2015/0327407 A1 | 11/2015 | Bednarcik et al. | |
| 2016/0143176 A1 | 5/2016 | Bernard et al. | |
| 2016/0249488 A1 | 8/2016 | Krietzman | |
| 2018/0066859 A1 | 3/2018 | Nguyen | |
| 2018/0132385 A1 | 5/2018 | Gosselin et al. | |
| 2018/0242483 A1 | 8/2018 | Krietzman et al. | |

* cited by examiner

SYSTEMS AND ASSEMBLIES FOR COOLING SERVER RACKS

CROSS REFERENCE TO RELATED APPLICATIONS

This application is a continuation of U.S. patent application Ser. No. 15/590,596 filed May 9, 2017, now U.S. Pat. No. 10,448,539, which is a continuation of U.S. patent application Ser. No. 14/216,005 filed on Mar. 17, 2014, now U.S. Pat. No. 9,648,784 which claims the benefit of, and priority to, U.S. Provisional Patent Application No. 61/802,267 filed on Mar. 15, 2013, the entire contents of each of which are incorporated herein by reference.

BACKGROUND

Due to the generation of large quantities of heat by electronics contained within data center server racks, large amounts of power are consumed for cooling of server racks. In the first decade of the 2000 millennium, data centers have consequently become one the largest consumers of electrical power in the United States and elsewhere around the world. In addition to the environmental consequences, the large power consumption is a major operating cost of a data center and requires large cooling equipment that takes space that could otherwise be used for installation of data servers.

SUMMARY

The embodiments of the present disclosure are directed to a cooling assembly and system for cooling server racks that reduce the power consumption required for cooling of server racks and makes available space for the installation of additional data servers. The cooling assembly and system for cooling server racks may be deployed for the installation of new server racks in a new data center. The present disclosure relates also to a cooling assembly and system that is retro-fittable for cooling existing server racks in an existing data center.

More particularly, in one aspect, the present disclosure relates to a cooling assembly for cooling server racks that includes: a server rack enclosure sub-assembly that includes at least one panel member defining a volume for receiving one or more server racks having a front portion and a rear portion. At least one of the one or more panel members is a rear panel member. At least one frame member defines an opening for receiving the rear portion of the one or more server racks to form a hot space between the rear panel member and the combination of the at least one frame member and the rear portion of the one or more server racks. A cooling sub-assembly is disposed in thermal communication with the hot space to enable cooling of at least one server supported in the server rack. The cooling sub-assembly includes a chassis configured to receive at least one heat exchange member for exchanging heat between a refrigerant fluid flowing through the heat exchange member and fluid flowing through the hot space that has been heated by the server.

In one exemplary embodiment, the frame member includes one or more horizontal frame members, one or more vertical frame members, or both.

In yet another exemplary embodiment, at least one of the one or more horizontal frame members is supported by one or more of the one or more vertical frame members. In one exemplary embodiment, one or more of the one or more vertical frame members or one or more of the one or more horizontal members or both the one or more of the one or more vertical frame members and the one or more of the one or more horizontal frame members further includes a sealing member to form a seal between the frame member and the rear portion of the server rack.

In still another exemplary embodiment, the frame member includes an impermeable material. In one exemplary embodiment, the impermeable material is selected from the group consisting of foam, rubber, and neoprene. In yet another exemplary embodiment, the frame member includes a selectively permeable material. In another exemplary embodiment, the selectively permeable material includes a brush assembly.

In a still further exemplary embodiment, the rear panel member includes at least one door to enable access to the rear portion of the one or more server racks.

In yet another exemplary embodiment, the chassis includes a set of one or more structural members configured and disposed to support the heat exchange member. The set of one or more structural members support the heat exchange member to enable the thermal communication with the server rack enclosure sub-assembly for the cooling of the server.

In one exemplary embodiment, the set of one or more frame members is configured and disposed to support at least one refrigerant fluid supply line and at least one refrigerant fluid return line. The refrigerant fluid supply line and the refrigerant fluid return line are in thermal and fluid communication with the heat exchange member.

In another exemplary embodiment, the set of one or more structural members is configured and disposed to support at least one forced convection cooling member in fluid communication with the heat exchange member to enable the cooling of the server. In still another exemplary embodiment, the forced convection cooling member includes a plurality of fans that are disposed to draw the hot fluid flowing in the hot space through the heat exchange member and over the top of the cooling enclosure sub-assembly.

In an alternative exemplary embodiment, the cooling assembly further includes a second server rack enclosure sub-assembly. The second server rack enclosure sub-assembly is configured to receive one or more server racks configured to support at least one server. The second server rack enclosure sub-assembly defines a frontal position with respect to the server rack and a rear position with respect to the server rack. The second server rack enclosure sub-assembly includes at least one panel member configured and disposed to selectively seal the rear position of the second server rack enclosure sub-assembly. A second cooling sub-assembly is disposed in thermal communication with the second server rack enclosure sub-assembly to enable cooling of the server when the server is supported in the server rack. The second server rack enclosure sub-assembly and the second cooling sub-assembly define a second confined hot space disposed between the panel member configured and disposed to selectively seal the rear position of the second server rack enclosure sub-assembly and the rear position of the one or more server racks enclosed therein. The second cooling sub-assembly includes structure configured to receive at least one heat exchange member for exchanging heat between a refrigerant fluid flowing through the heat exchange member and heated air or gas that removes heat from the server and which flows through the confined hot space. The first cooling sub-assembly and the second cooling sub-assembly each include the heat exchange members for exchanging heat between a refrigerant fluid flowing through the heat exchange member and heated air or gas that removes heat from the server. The first cooling sub-assembly and the second cooling sub-assembly each include a fluid section configured to enable fluid and thermal communication with the respective heat exchange member and define a first end and a second end. Each end enables the thermal communication. The first end of the fluid section of the second cooling sub-assembly is configured to couple in series with the second end of the fluid section of the first cooling sub-assembly to form a chain of cooling sub-assemblies.

In a further exemplary embodiment, the first and second fluid sections each further define respective electrical sections having first and second ends. The first end of the second electrical section is configured to enable electrical communication with the second end of the first electrical section.

In another aspect, the present disclosure relates also to a cooling sub-assembly for a cooling assembly for cooling server racks. The cooling assembly includes a server rack enclosure sub-assembly. The server rack enclosure sub-assembly is configured to receive one or more server racks configured to support at least one server. The server rack enclosure sub-assembly defines a frontal position with respect to the server rack and a rear position with respect to the server rack. The server rack enclosure sub-assembly includes at least one panel member configured and disposed to selectively seal the rear position of the server rack enclosure sub-assembly. The cooling sub-assembly is disposed in thermal communication with the server rack enclosure sub-assembly to enable cooling of the server when the server is supported in the server rack. The server rack enclosure sub-assembly and the cooling sub-assembly define a confined hot space disposed between the panel member configured and disposed to selectively seal the rear position of the server rack enclosure sub-assembly and the rear position of the one or more server racks. The cooling sub-assembly includes structure configured to receive at least one heat exchange member for exchanging heat between a refrigerant fluid flowing through the heat exchange member and heated air or gas that removes heat from at least one server. The structure is configured and disposed to support at least one forced convection cooling member in fluid communication with the heat exchange member to enable the cooling of the server when the server is supported in the server rack.

In one exemplary embodiment, the structure includes a set of one or more frame members configured and disposed to retain the heat exchange member. The set of one or more frame members support the heat exchange member to enable the thermal communication with the server rack enclosure sub-assembly for the cooling of the server when the server is supported in the server rack.

In still another exemplary embodiment, the set of one or more frame members is configured and disposed to support at least one refrigerant fluid supply line and at least one refrigerant fluid return line. The refrigerant fluid supply line and the refrigerant fluid return line are in thermal and fluid communication with the heat exchange member.

In a further exemplary embodiment, the set of one or more frame members is configured and disposed to support at least one forced convection cooling member in fluid communication with the heat exchange member to enable the cooling of the server when the server is supported in the server rack.

In still another aspect, the present disclosure relates also to a system for cooling server racks including a cooling assembly that includes a server rack enclosure sub-assembly. The server rack enclosure sub-assembly is configured to receive one or more server racks configured to support at least one server. The server rack enclosure sub-assembly defines a frontal position with respect to the server rack and a rear position with respect to the server rack. The server rack enclosure sub-assembly includes at least one panel member configured and disposed to selectively seal the rear position of the server rack enclosure sub-assembly. A cooling sub-assembly is disposed in thermal communication with the server rack enclosure sub-assembly to enable cooling of the server when the server is supported in the server rack. The server rack enclosure sub-assembly and the cooling sub-assembly define a confined hot space disposed between the panel member configured and disposed to selectively seal the rear position of the server rack enclosure sub-assembly and the rear position of the one or more server racks. The cooling sub-assembly includes structure configured to receive at least one heat exchange member for exchanging heat between a refrigerant fluid flowing through the heat exchange member and heated air or gas that removes heat from the server and which flows through the confined hot space. A central cooling circuit is in thermal communication with the heat exchanger of the cooling sub-assembly. The central cooling circuit is configured to remove heat transferred to the refrigerant fluid.

In one exemplary embodiment, the structure includes a set of one or more frame members configured and disposed to retain the heat exchange member. The set of one or more frame members support the heat exchange member to enable the thermal communication with the server rack enclosure sub-assembly for the cooling of the server when the server is supported in the server rack.

In still another exemplary embodiment, the set of one or more frame members is configured and disposed to support at least one refrigerant fluid supply line and at least one refrigerant fluid return line. The heat exchange member is in fluid and thermal communication with the central cooling circuit via the refrigerant fluid supply line and the refrigerant fluid return line.

In yet another exemplary embodiment, the set of one or more frame members is configured and disposed to support at least one forced convection cooling member in fluid communication with the heat exchange member to enable the cooling of the server when the server is supported in the server rack.

In yet another exemplary embodiment, the system further includes a second server rack enclosure sub-assembly. The second server rack enclosure sub-assembly is configured to receive one or more server racks configured to support at least one server. The second server rack enclosure sub-assembly defines a frontal position with respect to the server rack and a rear position with respect to the server rack. The second server rack enclosure sub-assembly includes at least one panel member configured and disposed to selectively seal the rear position of the second server rack enclosure sub-assembly. A second cooling sub-assembly is disposed in thermal communication with the second server rack enclosure sub-assembly to enable cooling of the server when the server is supported in the server rack. The second server rack enclosure sub-assembly and the second cooling sub-assembly define a second confined hot space disposed between the panel member configured and disposed to selectively seal the rear position of the second server rack enclosure sub-assembly and the rear position of the one or more server racks enclosed therein. The second cooling sub-assembly includes structure configured to receive at least one heat exchange member for exchanging heat between a refrigerant fluid flowing through the heat exchange member and heated air or gas that removes heat from the server and which flows through the confined hot space. The first cooling sub-assembly and the second cooling sub-assembly each include the heat exchange members for exchanging heat between a refrigerant fluid flowing through the heat exchange member and heated air or gas that removes heat from the server. The first cooling sub-assembly and the second cooling sub-assembly each include a fluid section configured to enable fluid and thermal communication with the respective heat exchange member and define a first end and a second end. Each end enables the thermal communication. The first end of the fluid section of the second cooling sub-assembly is configured to couple in series with the second end of the fluid section of the first cooling sub-assembly to form a chain of cooling sub-assemblies.

In still another exemplary embodiment, the first and second fluid sections each further define respective electrical sections having first and second ends. The first end of the second electrical section is configured to enable electrical communication with the second end of the first electrical section.

BRIEF DESCRIPTION OF THE DRAWINGS

Various embodiments of the present disclosure are described with reference to the accompanying drawings wherein.

DETAILED DESCRIPTION

The present disclosure relates to an air flow distribution system for server racks that significantly reduces the power requirements for cooling server racks within data centers.

Various embodiments of the present disclosure are described with reference to the accompanying drawings as follows.

Figure 1:
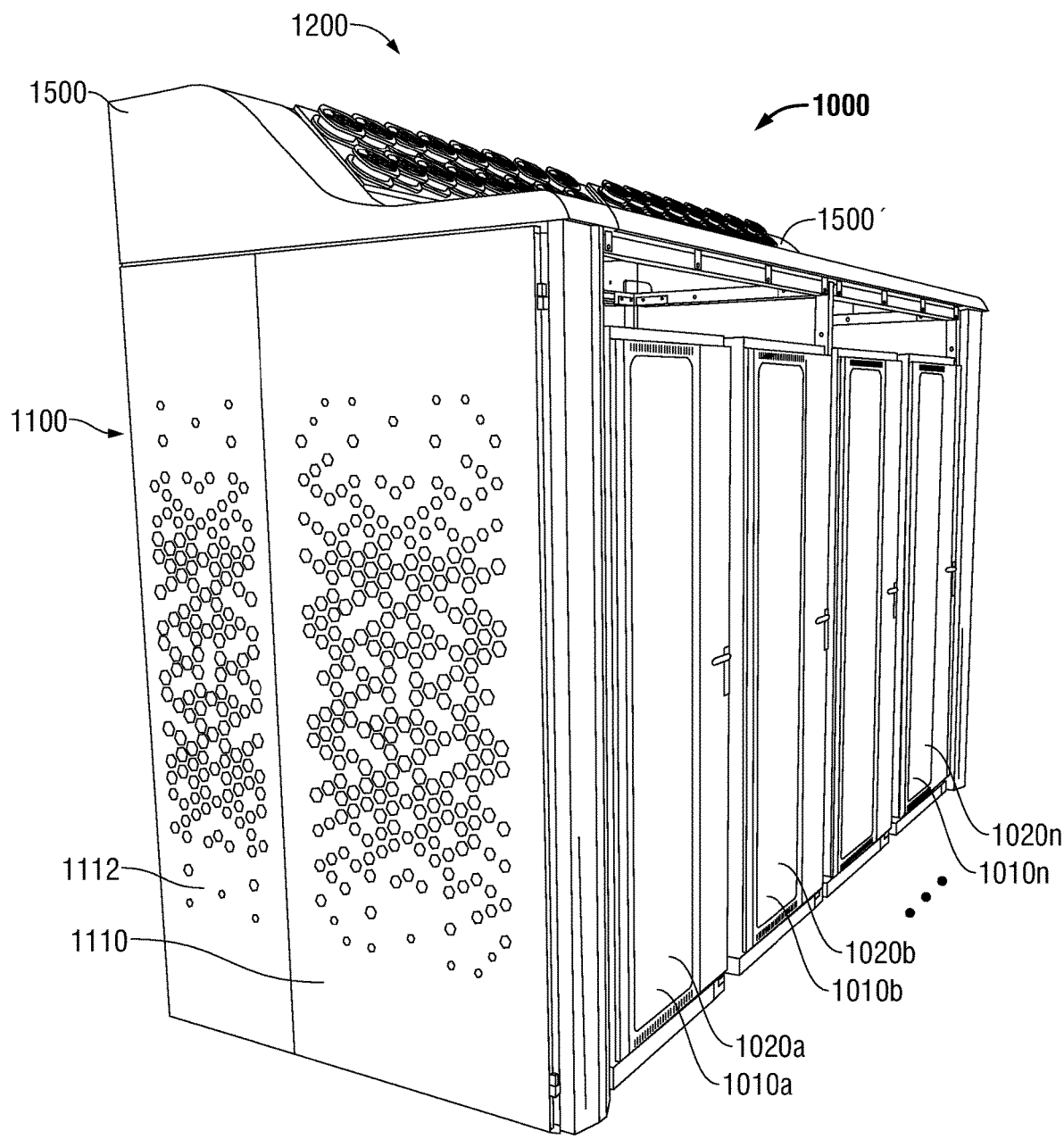
FIG. 1 is a perspective view of one embodiment a cooling assembly according to the present disclosure that illustrates a frontal view of server racks in enclosures that are received within the cooling assembly.

FIGS. 1-14 describe one or more cooling assemblies for cooling server racks according to embodiments of the present disclosure. Referring particularly to FIG. 1, there is disclosed one embodiment of a cooling assembly 1000 according to the present disclosure that illustrates a frontal view of server racks (not directly visible) in enclosures 1010a, 1010b . . . 1010n that are received within the cooling assembly 1000. The enclosures 1010a, 1010b . . . 1010n include sealing members 1020a, 1020b . . . 1020n that may include perforated doors that allow the flow of air to flow through to enable cooling of the servers (not shown) in the server racks (not shown) inside of the enclosures 1010a, 1010b . . . 1010n. The sealing members 1020a, 1020b . . .

Figure 2:
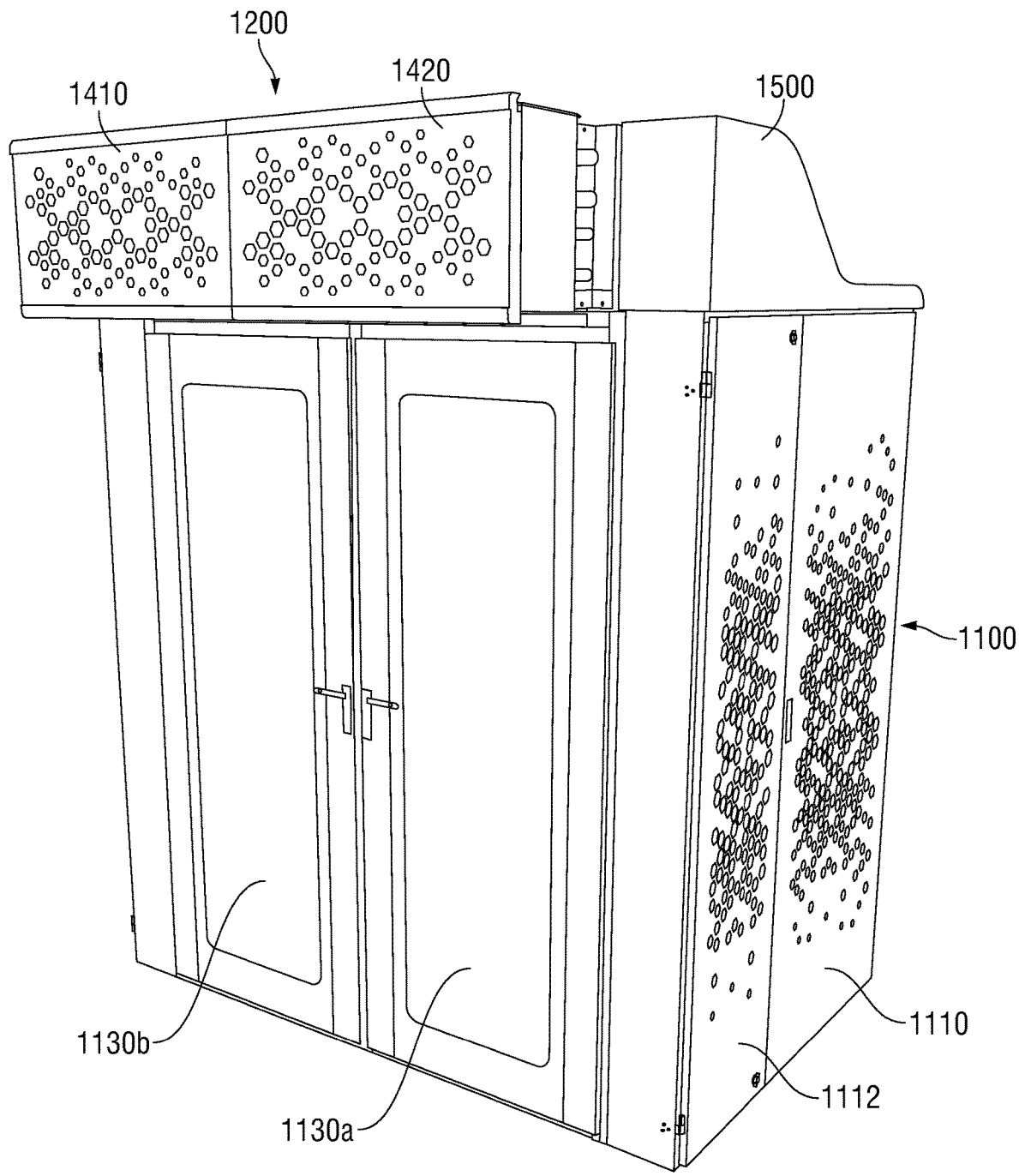
FIG. 2 is a perspective view of one embodiment of a cooling assembly according to the present disclosure that illustrates a rear view of the cooling assembly that includes rear panel members that forms a hot space between the rear panel member and the rear portion of server racks.
Figure 3C:
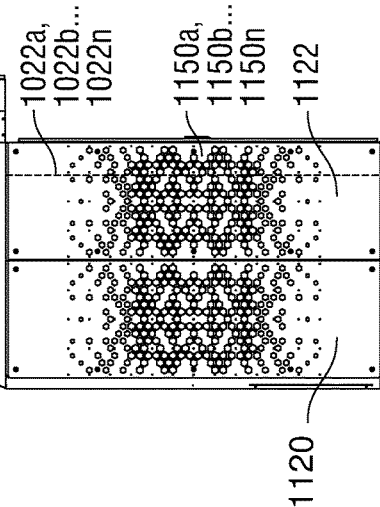
FIG. 3C is a side elevation view of the cooling assembly of FIG. 1 and FIGS. 3A and 3C.

1020n define a proximal or frontal portion of the enclosures 1010a, 1010b . . . 1010n. The enclosures 1010a, 1010b . . . 1010n also define a rear portion 1022a, 1022b . . . 1022n, such as a perforated screen, as illustrated by the dashed line in FIG. 3C. Referring particularly to FIGS. 1 and 2, the cooling assembly 1000 includes a server rack enclosure sub-assembly 1100 and a cooling sub-assembly 1200. Control boxes 1410 and 1420, positioned on a rear side of cooling sub-assembly 1200, are described in more detail below with respect to FIG. 10. The server rack enclosure sub-assembly 1100 includes one or more first side panel members 1110 and 1112 and as illustrated in FIG. 3C one or more second side panel members 1120 and 1122. Specifically, first and second side panel members 1110 and 1120 are proximal panel members with respect to the frontal portions defined by the sealing members 1020a, 1020b . . . 1020n while first and second side panel members 1112 and 1122 are distal panel members with respect to the sealing members 1020a, 1020b . . . 1020n.

As best illustrated in FIG. 2, the server rack enclosure sub-assembly 1100 also includes rear panel members 1130a and 1130b that correspond to rear portions 1022a, 1022b . . . 1022n (additional adjacent rear panel members corresponding to rear portions through 1022n are not shown).

Figure 13:
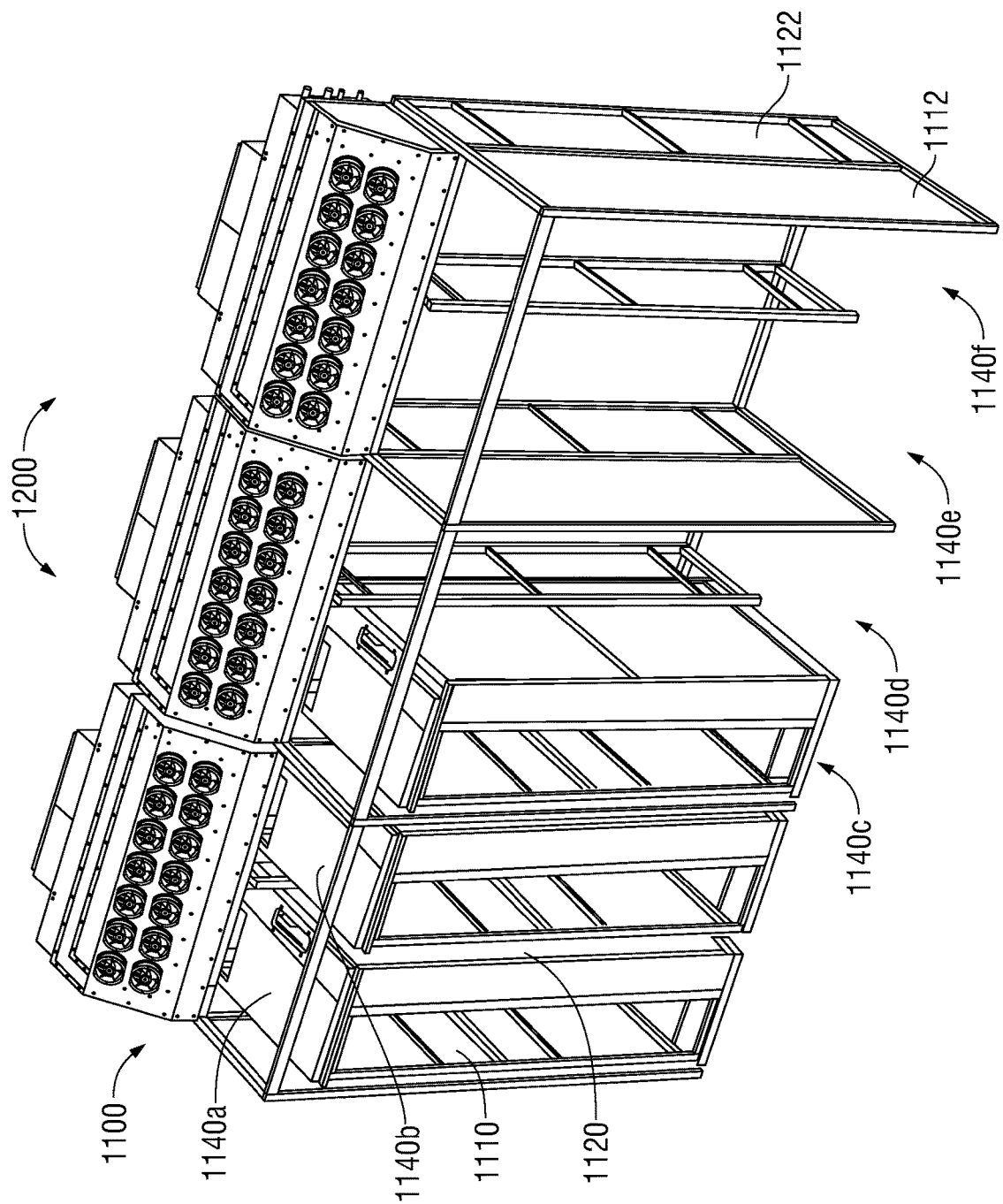
FIG. 13 is a perspective view of multiple cooling assemblies from an upper vantage point.
Figure 14:
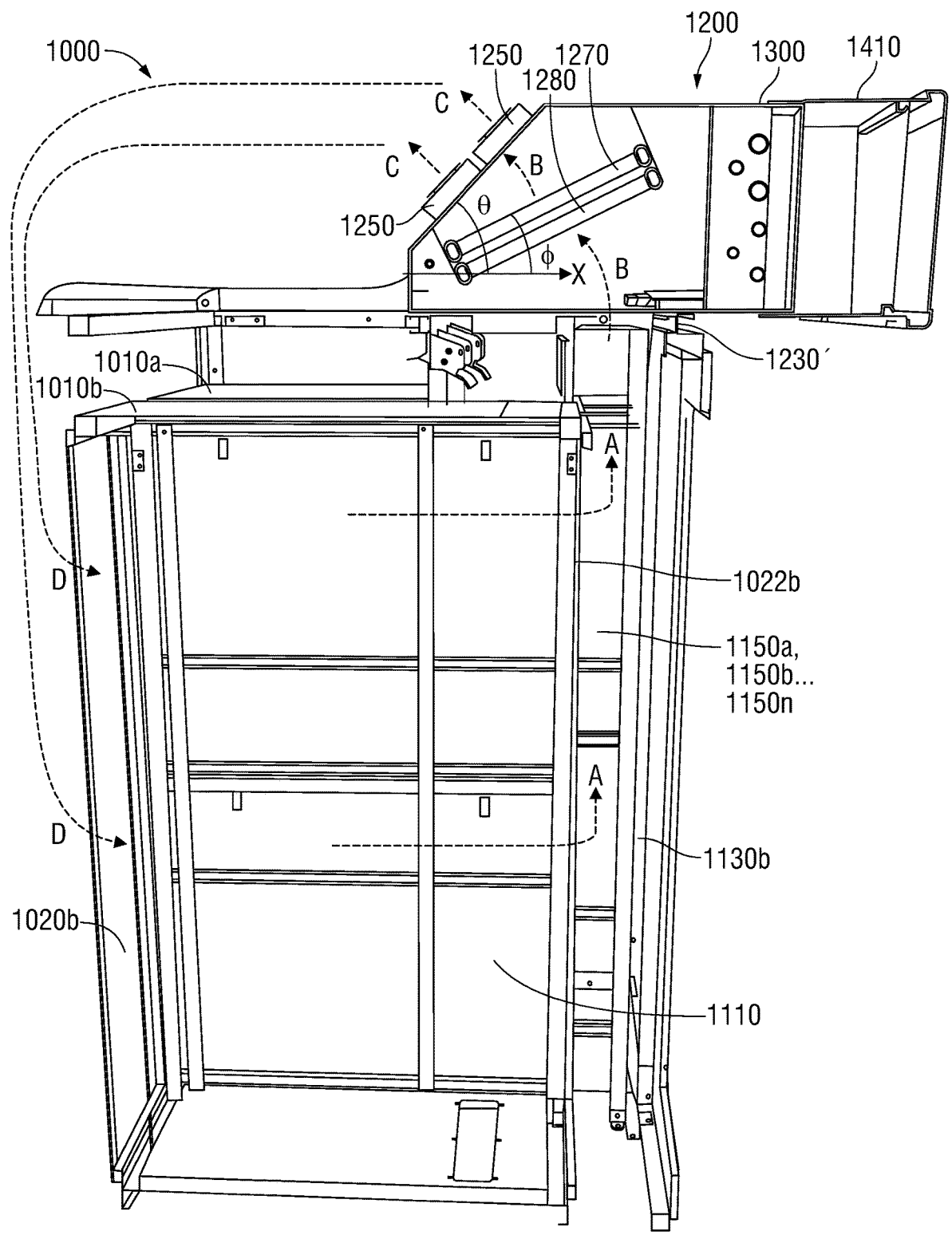
FIG. 14 is a cross-sectional view of the cooling assembly.

As best illustrated in FIG. 2, FIG. 13 and FIG. 14, the side panel members 1110, 1120, the rear panel members 1130a, 1130b and the side panel members 1112, 1122 define volumes 1140a, 1140b, 1140c, 1140d, 1140e, 1140f . . . for receiving one or more server racks.

As best illustrated in FIG. 3C and FIG. 14, rear portions 1022a, 1022b . . . 1022n, of the enclosures 1010a, 1010b . . . 1010n are received within the respective volumes 1140a, 1140b, 1140c, 1140d, 1140e, 1140f . . . to form hot spaces 1150a, 1150b, . . . 1150n between the respective rear panel members 1130a and 1130b . . . and the rear portions rear portions 1022a, 1022b . . . 1022n of the respective enclosures 1010a, 1010b . . . 1010n.

Figure 4A:
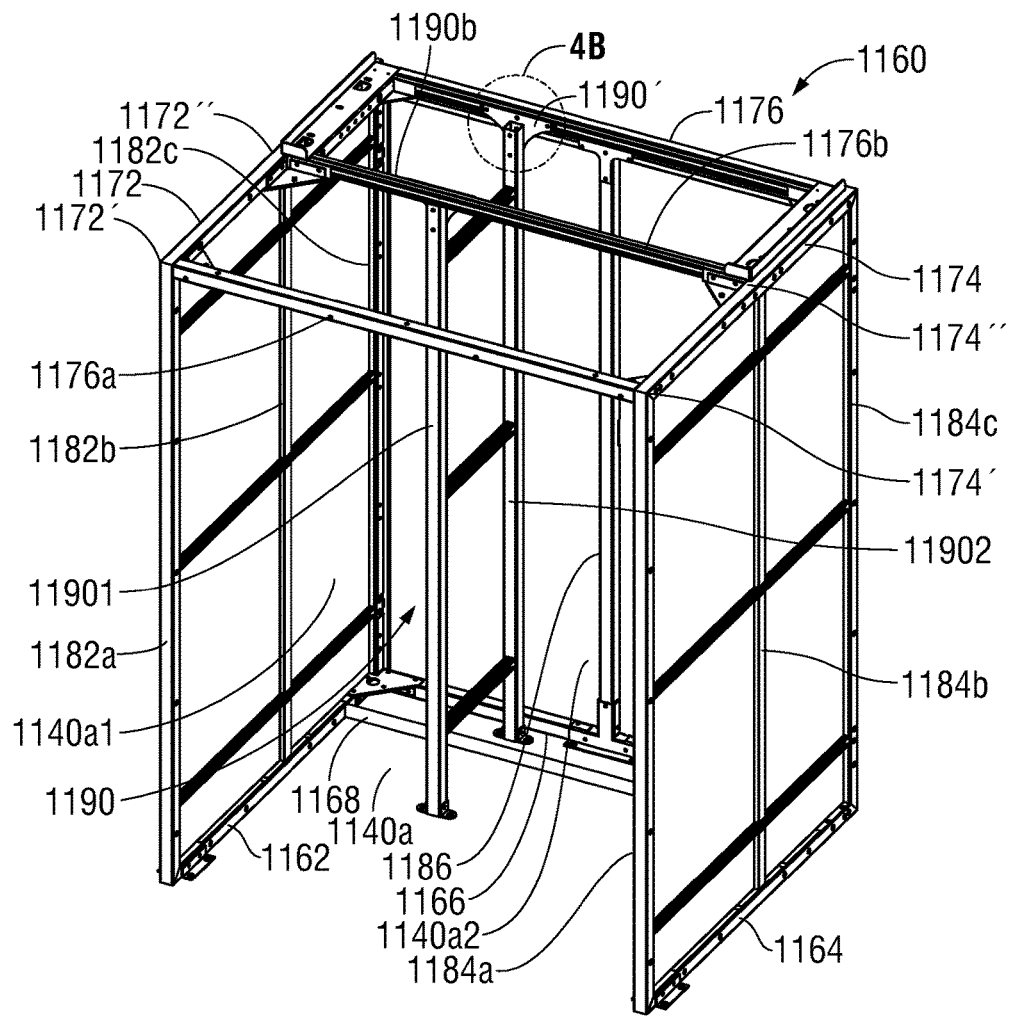
FIG. 4A is a perspective partial view of a server rack enclosure sub-assembly from a frontal position that is included within the cooling assembly of FIG. 2.
Figure 4B:
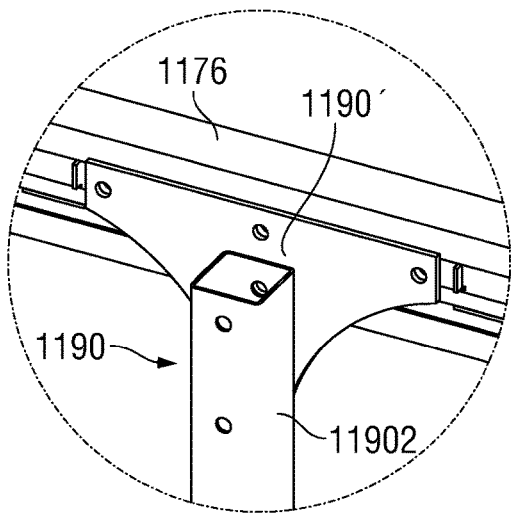
FIG. 4B is a detailed view of a connection between a vertical frame member and a horizontal frame member included within the server rack enclosure sub-assembly of FIG. 4B.

Referring to FIGS. 4A-8C, and as best illustrated in FIGS. 4A and 4B, the one or more first side panel members 1110 and 1112, the one or more second side panel members 1120 and 1122, and the rear panel members 1130a and 1130b are supported by at least one frame member assembly 1160 that may include one or more lower horizontal frame members 1162, 1164 and 1166 and one or more upper horizontal frame members 1172, 1174 and 1176. The lower horizontal frame members 1162 and 1164 may be orthogonal to the lower horizontal frame member 1166, which is distal with respect to the sealing members 1020a, 1020b . . . 1020n.

The upper horizontal frame members 1172, 1174 and 1176 may be supported by respective vertical frame members 1182a, 1182b, 1182c, and 1184a, 1184b, 1184c and 1186. The upper horizontal frame members 1172 and 1174 may be orthogonal to the upper horizontal frame member 1176, which is also distal with respect to the sealing members 1020a, 1020b . . . 1020n.

The upper horizontal frame members 1172 and 1174 and the upper horizontal frame member 1176 respectively may overlap the lower horizontal frame members 1162 and 1164 and the lower horizontal frame member 1166.

The respective vertical frame members 1182a, 1182b, 1182c, and 1184a, 1184b, 1184c and 1186 may be supported by the one or more lower horizontal frame members 1162, 1164 and 1166.

Additional upper horizontal frame members 1176a, 1176b may link and interconnect with upper horizontal frame members 1172 and 1174 at the intersections 1172', 1172" with vertical support members 1182a, 1182b and at the intersections 1174', 1174" with vertical support members 1184a, 1184b, respectively.

A ladder type structure 1190, that includes a proximal vertical member 11901 and a distal vertical member 11902, may be vertically mounted and intersects with and supports upper horizontal cross frame members 1176b and 1176 at intersections 1190b, 1190' to partially form a partition within the volume 1140a to form a first sub-volume 1140a1 and a second sub-volume 1140a2.

Figure 5A:
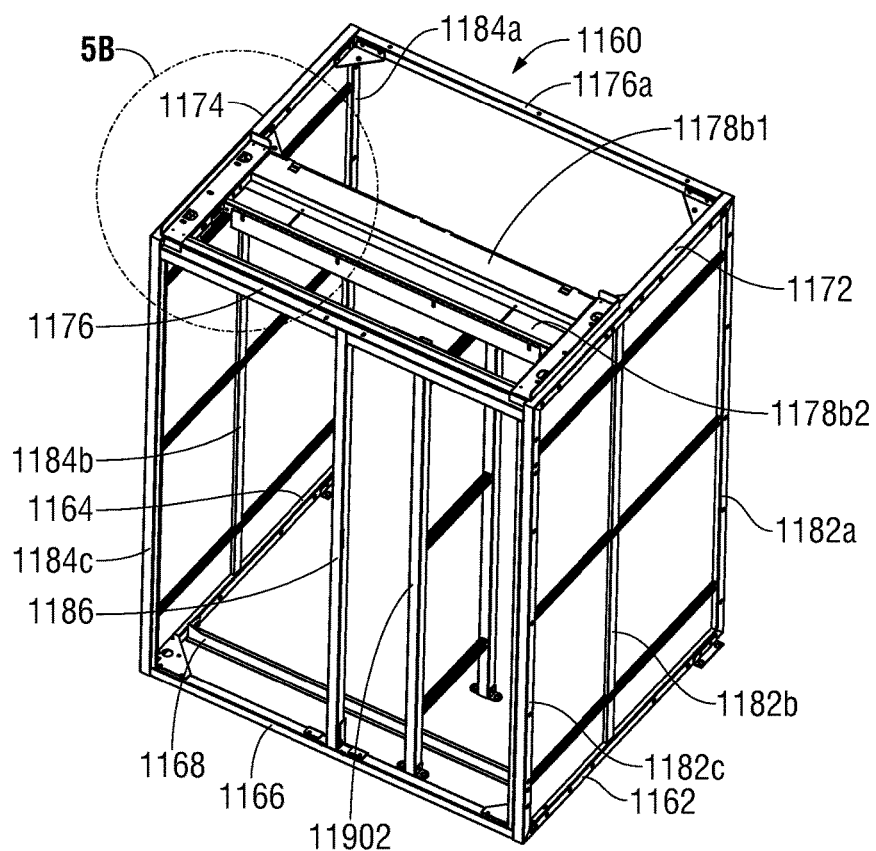
FIG. 5A is a perspective partial view from a rear position of the server rack enclosure sub-assembly of FIG. 4A that is included within the cooling assembly of FIG. 2.
Figure 5B:
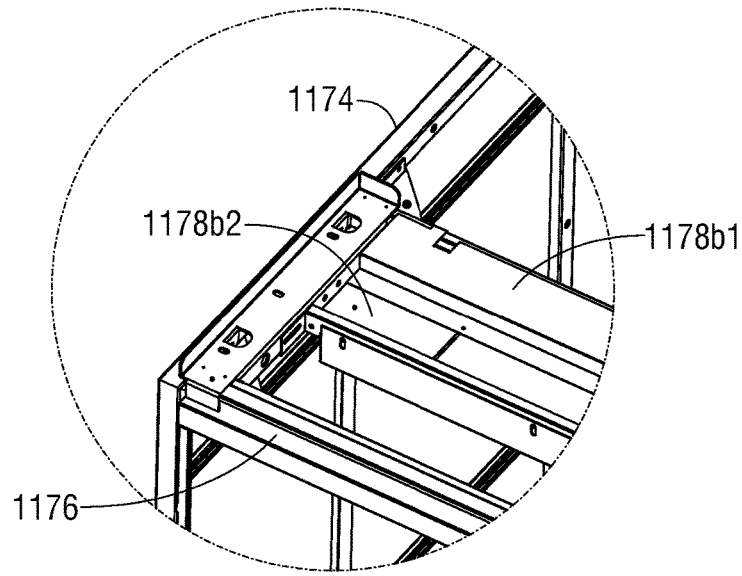
FIG. 5B is a detailed view of a connection between vertical frame members and horizontal frame members included within the server rack enclosure sub-assembly of FIG. 5B.

As best illustrated in FIGS. 5A and 5B, the frame assembly 1160 may further include a front upper air baffle 1178b1 and a rear upper air baffle 1178b2 that each traverse or span the frame assembly 1160 between the upper horizontal orthogonal frame members 1172 and 1174.

Figure 6:
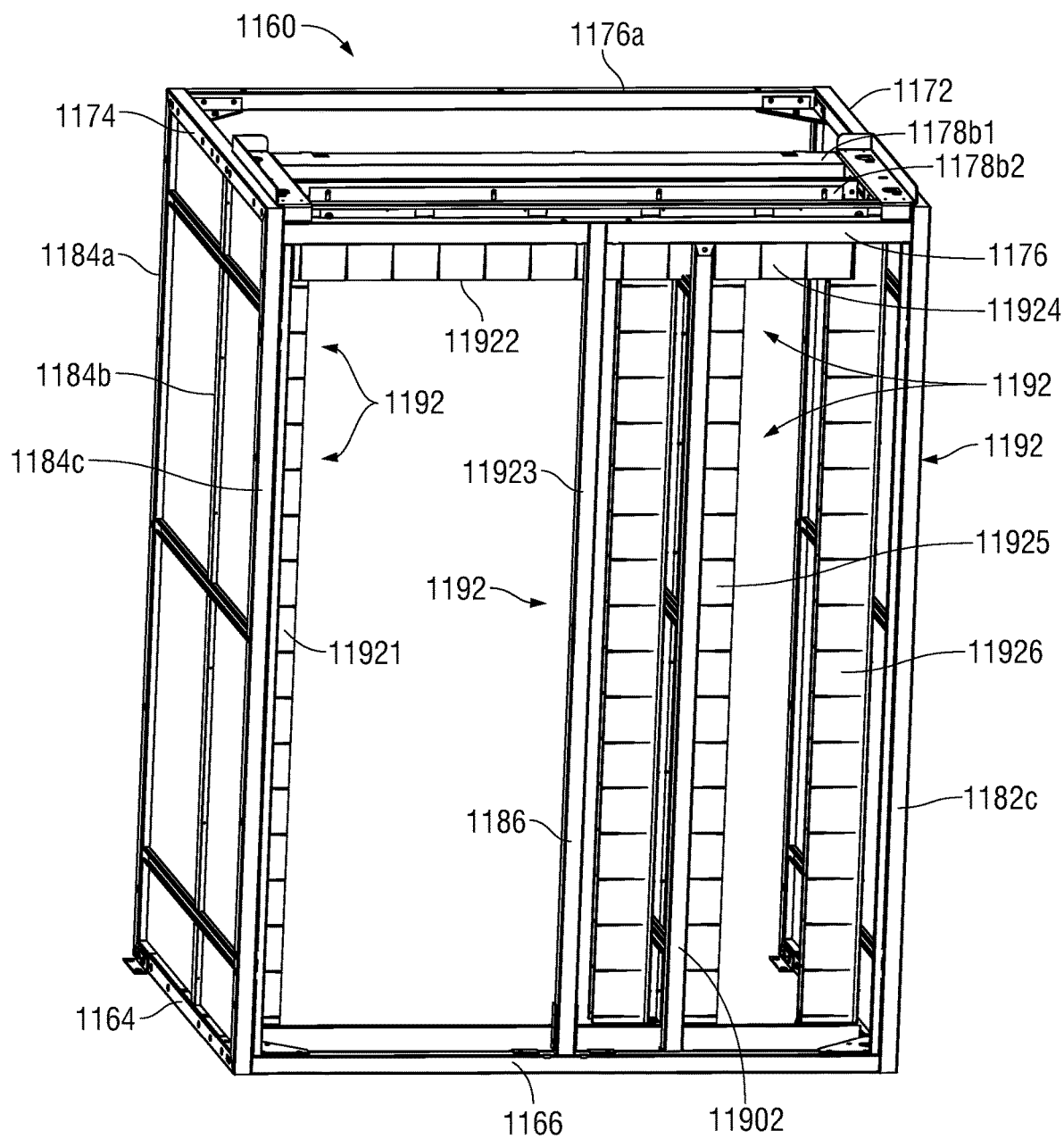
FIG. 6 is a perspective view of a portion of the server rack enclosure sub-assembly of FIGS. 5A and 5B that is included within the cooling assembly of FIG. 1 or 2 illustrating sealing members that partially form the hot space.
Figure 7B:
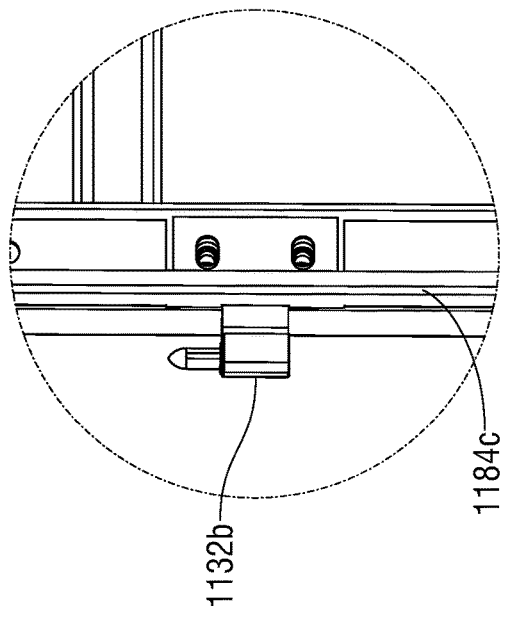
FIG. 7B is a detailed view of a hinge member illustrated in FIG. 7A.
Figure 7C:
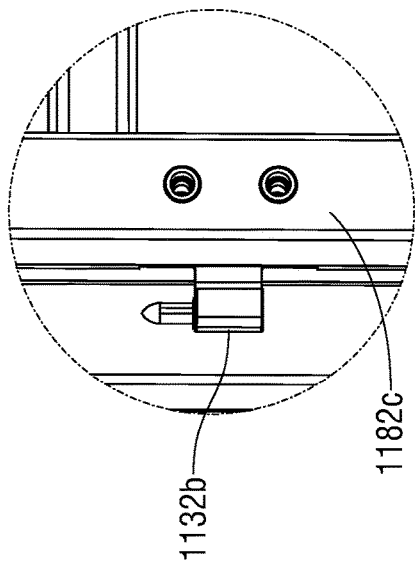
FIG. 7C is a detailed view of another hinge member illustrated in FIG. 7A.
Figure 7A:
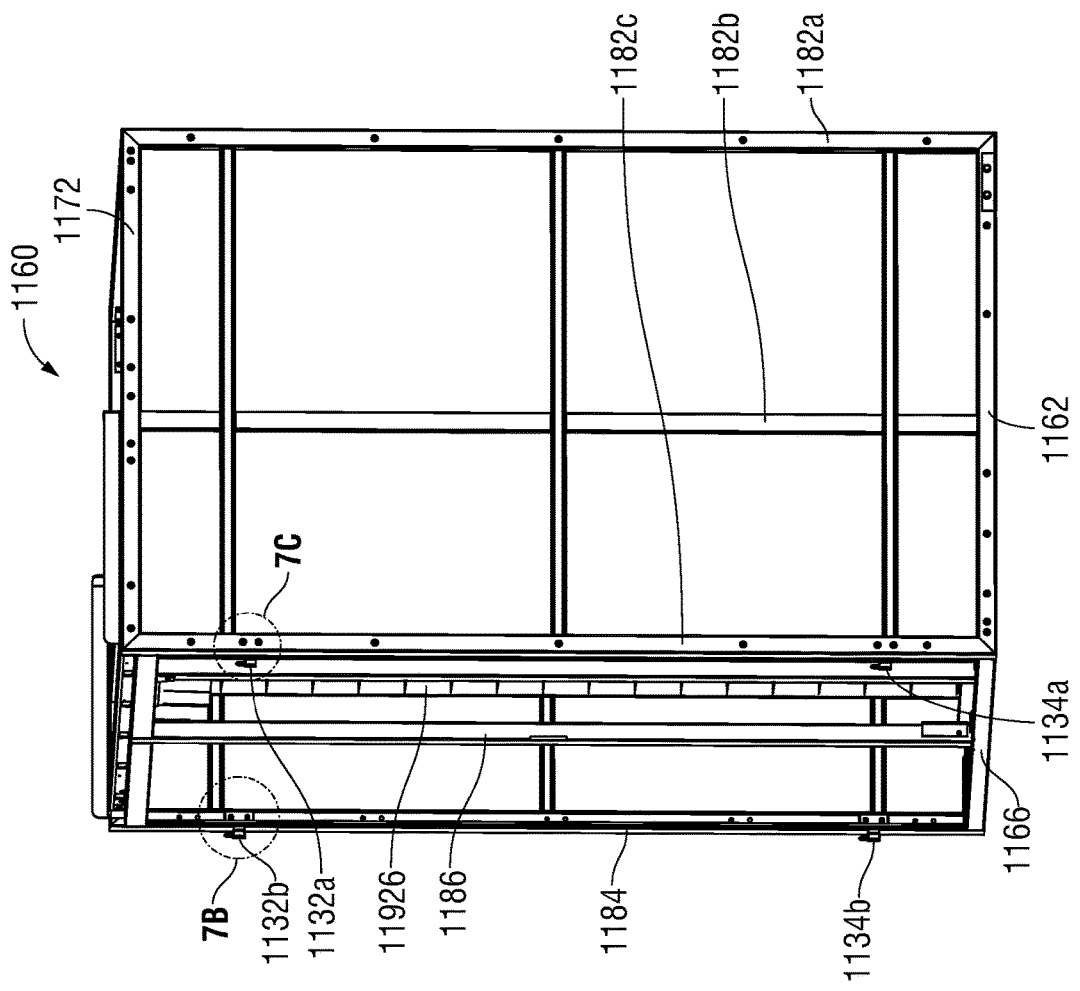
FIG. 7A is another perspective view of a portion of the server rack enclosure sub-assembly of FIG. 6 that is included within the cooling assembly of FIG. 1 or 2 illustrating sealing members that partially form the hot space.
Figure 8B:
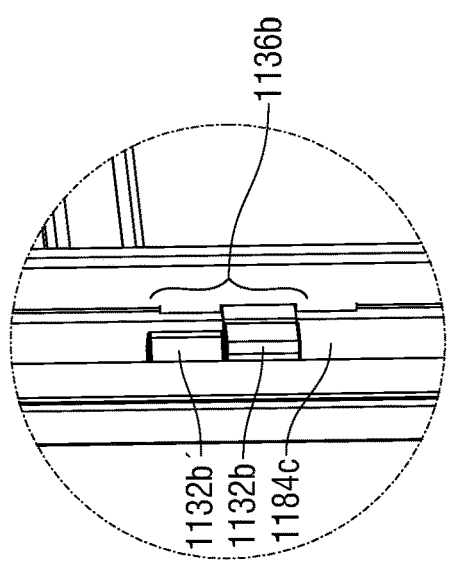
FIG. 8B is a detailed view of a hinge member illustrated in FIG. 8A.
Figure 8C:
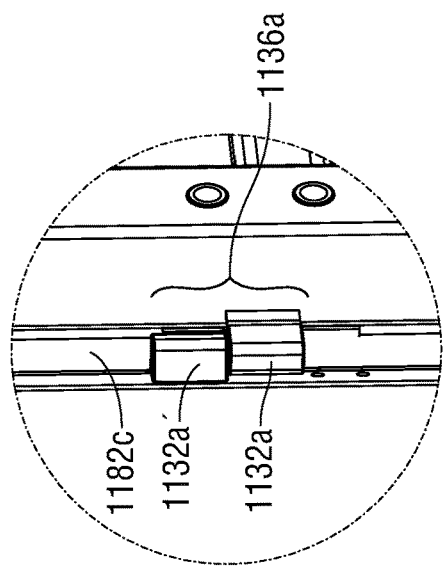
FIG. 8C is detailed view of another hinge member illustrated in FIG. 8A.
Figure 8A:
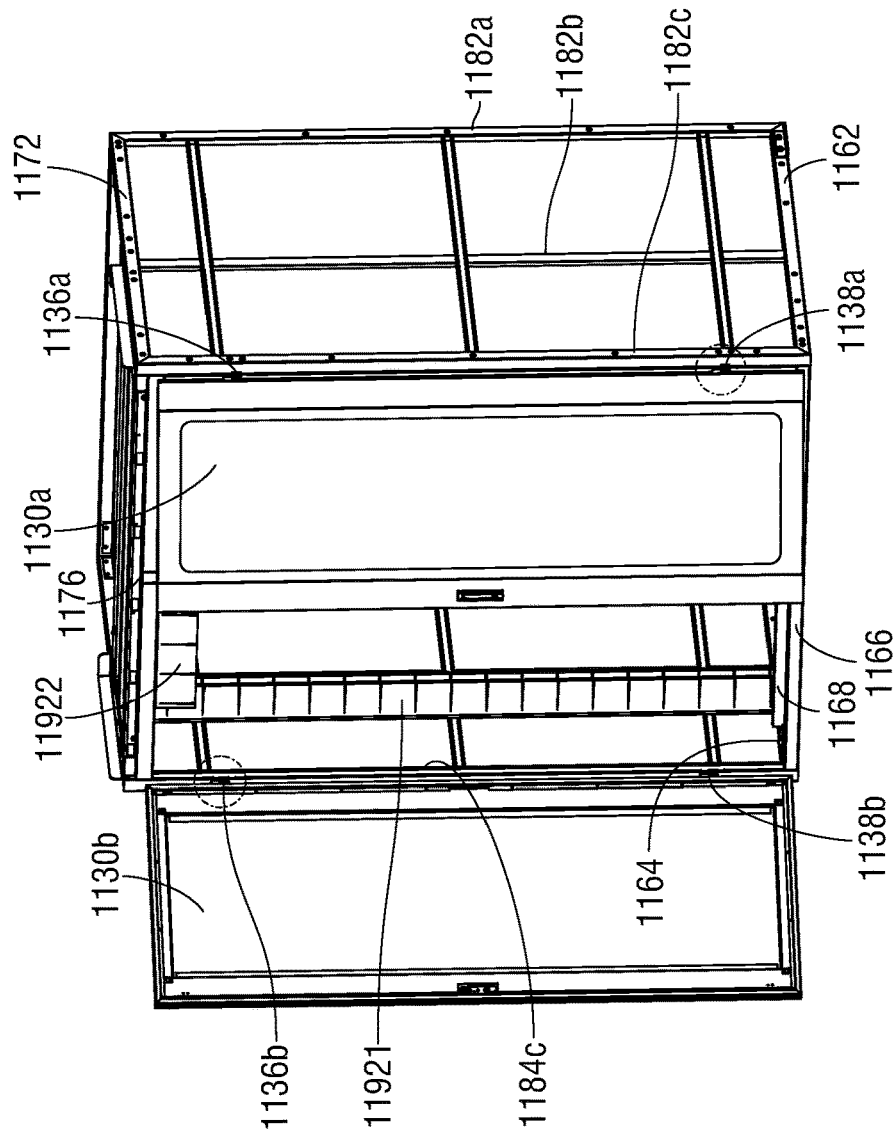
FIG. 8A is a perspective view of the server rack enclosure sub-assembly that includes rear panel members that at least partially form the hot space.

As best illustrated in FIG. 6, and partially illustrated in FIGS. 7A and 8A, the frame member assembly 1160 may further include one or more sealing members 1192 in the vicinity of the front upper air baffle 1178b1 and rear upper air baffle 1178b2 to form a seal between the frame member assembly 1160 and the rear portions 1022a, 1022b, . . . 1022n of the enclosures 1010a, 1010b . . . 1010n of the server racks. Thus the sealing members 1192 at least partially confine and at least partially seal the hot spaces 1150a, 1150b, . . . 1150n between the respective rear panel members 1130a and 1130b . . . and the rear portions 1022a, 1022b . . . 1022n of the respective enclosures 1010a, 1010b . . . 1010n.

More particularly, sealing members 1192 include seal members 11921, 11923, 11925 and 11926 that are mounted along vertical frame members 1184c, 1186, 11902 and 1182c, respectively.

In one embodiment, as illustrated, the seal member 11922 is mounted horizontally downward along upper horizontal distal frame member 1176 between the vertical frame member 1184c and the distal vertical member 11902 of the ladder-type structure 1190. Additionally, seal member 1194 may be mounted horizontally downward along upper horizontal distal frame member 1176 between the distal vertical member 11902 of the ladder-type structure 1190 and the vertical frame member 1182c.

As illustrated in FIGS. 6, 7A and 7B, the seal members 1192 may be selectively permeable to allow penetration by personnel such as when personnel insert an arm through the seal members such that sealing members 1192 are made from a selectively permeable material. The selectively permeable seal members 1192 may be formed as brush assemblies.

Alternatively, the sealing members 1192 may be made from an impermeable material. In one embodiment, the impermeable material includes a material selected from the group consisting of foam, rubber, and neoprene.

As illustrated in FIGS. 4A, 5A and 8A, an additional lower horizontal frame member 1168 that is disposed parallel to and proximally with respect to lower horizontal frame member 1166 extends orthogonally between, and is coupled to, lower horizontal frame member 1162 and lower horizontal frame member 1164. Frame member 1168 prevents air bypass under the server cabinet (not shown) and also restricts the positioning of the server cabinet (not shown) within the server rack enclosure sub-assembly 1100, thereby maintaining the hot spaces 1150a, 1150b, . . . 1150n (see FIG. 3C).

In one embodiment, as best illustrated in FIG. 2 and FIG. 8A, the rear panel members 1130a and 1130b are at least partially configured as at least one door to enable access to the hot spaces 1150a, 1150b, . . . 1150n between the respective rear panel members 1130*a* and 1130*b* . . . and the rear portions 1022*a*, 1022*b* . . . 1022*n* of the respective enclosures 1010*a*, 1010*b* . . . 1010*n*. The location and details of upper frame hinge members 1132*a* and 1132*b* and lower frame hinge members 1134*a* and 1134*b* for rear panel members 1130*a* and 1130*b*, respectively, are illustrated in FIGS. 7A, 7B and 7C. Additionally, the assembly of door upper hinge members 1132*a*' and 1132*b*' and door lower hinge members 1134*a*' and 1134*b*' of rear panel members 1130*a* and 1130*b*, respectively, to form upper hinges 1136*a* and 1136*b* and lower hinges 1138*a* and 1138*b* of rear panel members 1130*a* and 1130*b*, respectively, is illustrated in FIGS. 8A, 8B and 8C.

As described above, referring now to FIGS. 9A to 11, in addition to server rack enclosure sub-assembly 1100, the cooling assembly 1000 includes cooling sub-assembly 1200 that is disposed in thermal communication with the hot spaces 1150*a*, 1150*b*, . . . 1150*n* between the respective rear panel members 1130*a* and 1130*b* . . . and the rear portions rear portions 1022*a*, 1022*b* . . . 1022*n* of the respective enclosures 1010*a*, 1010*b* . . . 1010*n* to enable cooling of the servers (not shown) in the server racks (not shown) inside of the enclosures 1010*a*, 1010*b* . . . 1010*n*.

The cooling sub-assembly or chassis 1200 is configured to receive one or more heat exchange members. In one exemplary embodiment, the cooling sub-assembly 1200 defines a proximal portion 1212 and a distal portion 1214 and a first end 1201 and a second end 1202. The chassis 1200 includes an upper supporting frame member 1210 which includes a rectangularly-shaped upper edge surface member 1220, a lateral edge member 1222, and a forced-convection receiving member 1224 that interconnects the upper edge surface member 1220 and the lateral edge member 1222. The forced convection receiving member 1224 defines a slope at an angle Θ with respect to the upper edge surface member 1220 (or with respect to the horizontal direction X illustrated in FIG. 9A). The forced-convection receiving member 1224 defines an aperture 1224', that is exemplarily illustrated as rectangularly-shaped, to receive a plurality of forced-convection members 1250, e.g., motor-driven fans, that are mounted on a supporting plate member 1252 to enable flow of air forced through the aperture 1224' and the plurality of forced convection members 1250 (see FIG. 10).

In one exemplary embodiment, a rectangular lower perimeter or first frame member assembly 1230, disposed opposite to the upper edge surface 1220, defines a lower rectangularly-shaped opening 1230'. The rectangular lower perimeter frame member 1230 includes a proximal longitudinal frame member 1232 and a distal longitudinal frame member 1234. First lateral frame member 1236 and second lateral frame member 1238 are disposed respectively at first end 1201 and second end 1202 and interconnect with proximal longitudinal frame member 1232 and distal longitudinal frame member 1234, respectively, at the opposing ends 1201 and 1202 of the proximal longitudinal frame member 1232 and distal longitudinal frame member 1234 to define the lower rectangularly-shaped opening 1230'.

Figure 10:
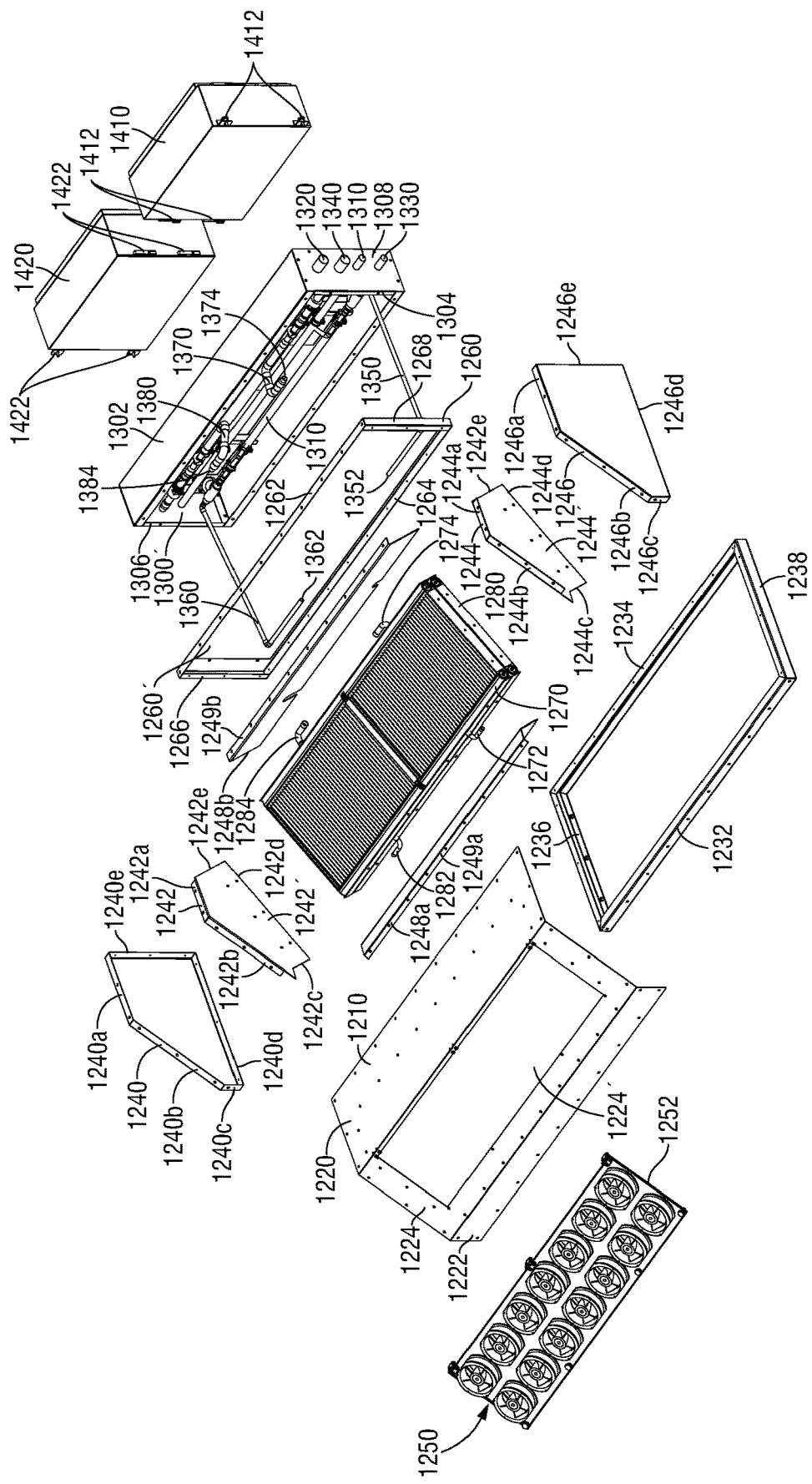
FIG. 10 is a perspective exploded view of the cooling sub-assembly of FIGS. 9A to 9D.

The chassis 1200 further includes a second frame member assembly 1260 that is exemplarily illustrated, e.g., in FIG. 10, as a rectangularly-shaped frame member assembly, that is similar in configuration to the first frame member assembly 1230. The second frame member 1260 includes an upper longitudinal frame member 1262 and a lower longitudinal frame member 1264. First lateral frame member 1266 and second lateral frame member 1268 are disposed respectively at first end 1201 and second end 1202 and interconnect with upper longitudinal frame member 1262 and lower longitudinal frame member 1264, respectively, at the opposing ends 1201 and 1202 of the upper longitudinal frame member 1262 and lower longitudinal frame member 1264, to define a rectangularly-shaped opening 1260'.

The cooling sub-assembly or chassis 1200 further includes a pair of heat exchange support members each having an irregularly-shaped polygonal profile defining a plurality of edge surfaces. First heat exchange support member 1242 is disposed in proximity to the first end 1201 and the second heat exchange support member 1244 is disposed in proximity to the second end 1202. The first heat exchange support member 1242 and the second heat exchange support member 1244 are each configured such that the profile of the support members 1242 and 1244 at least partially conforms to the configuration of the upper supporting frame member 1210. along first edges 1242*a*, 1244*a* and second edges 1242*b*, 1244*b*, respectively.

First heat exchange support member 1242 and the second heat exchange support member 1244 each further include third edges 1242*c*, 1244*c*, fourth edges 1242*d*, 1244*d*, and fifth edges 1242*e*, 1244*e*, respectively.

The chassis 1200 further includes a proximal longitudinal heat exchange support member 1248*a* and a distal longitudinal heat exchange support member 1248*b*. The proximal longitudinal heat exchange support member 1248*a* has a curved cross-sectional profile that conforms to the contour of third edges 1242*c*, 1244*c* to enable at least partial interface between the proximal longitudinal heat exchange support member 1248*a* and the third edges 1242*c*, 1244*c* in the vicinity of the first end 1201 and the second end 1202, respectively. The proximal longitudinal heat exchange support member 1248*a* includes a longitudinal edge 1249*a* that is configured to interface with, and be supported by, forced-convection receiving member 1224 of upper supporting frame member 1210. Similarly, distal longitudinal heat exchange support member 1248*b* includes a longitudinal edge 1249*b* that is configured to interface with, and be supported by, upper edge surface member 1220 of upper supporting frame member 1210.

The distal longitudinal heat exchange support member 1248*b* has a J-shaped cross-sectional profile that enables at least partial interface between the distal longitudinal heat exchange support member 1248*a* and the third edges 1242*c*, 1244*c* in the vicinity of the first end 1201 and the second end 1202, respectively.

The chassis 1200 may further include a first end panel member 1240 that is configured to be disposed in the vicinity of first end 1201. Similarly, chassis 1200 may further include a second end panel member 1246 that is configured to be disposed in the vicinity of second end 1202. The first end panel member 1240 and the second end panel member 1246 each support the upper supporting frame member 1210 in the following manner.

The first end panel member 1240 and the second end panel member 1246 each have a first edge 1240*a*, 1246*a* that is configured to interface with, and support, upper edge surface 1220 in the vicinity of first end 1201 and second end 1202.

Similarly, the first end panel member 1240 and the second end panel member 1246 each have a second edge 1240*b*, 1246*b* that is configured to interface with, and support, forced-convection receiving member 1224 in the vicinity of first end 1201 and second end 1202.

Additionally, the first end panel member 1240 and the second end panel member 1246 each have a third edge 1240c, 1246c that is configured to interface with, and support, lateral edge member 1222 in the vicinity of first end 1201 and second end 1202.

The first end panel member 1240 and the second end panel member 1246 each have a fourth edge 1240d, 1246d that is configured to interface with, and support, first lateral frame member 1236 of first frame member assembly 1230 by fourth edge 1240d in the vicinity of first end 1201 and second lateral frame member 1238 of first frame member assembly 1230 by fourth edge 1246d in the vicinity of second end 1202.

Additionally, the first end panel member 1240 and the second end panel member 1246 each have a fifth edge 1240e, 1246e that is configured to interface with, and support, first lateral frame member 1266 of second frame member assembly 1260 by fifth edge 1240e of in the vicinity of first end 1201 and second lateral frame member 1268 of second frame member assembly 1260 by fifth edge 1246e in the vicinity of second end 1202.

As described above, the chassis 1200 is further configured to receive at least one heat exchange member. More particularly, referring particularly to FIG. 9B, FIG. 9D, FIG. 10 and FIG. 14, in one exemplary embodiment, the chassis 1200 further includes first and second heat exchange members, e.g., heat exchangers 1270 and 1280 that are flat plate type coil heat exchangers disposed physically parallel to one another within a volume 1290 defined by the upper supporting frame member 1210, the first frame member assembly 1230, the second frame member assembly 1260 and the first end panel member 1240 and the second end panel member 1246 when assembled and interconnected together as described above.

The first and second heat exchangers 1270 and 1280 are supported in proximity to the first end 1201 on inner surface 1242' of the first heat exchange support member 1242 in proximity to and along the fourth edge 1242d.

Similarly, the first and second heat exchangers 1270 and 1280 are supported in proximity to the second end 1201 on an inner surface (not shown) of the second heat exchange support member 1244 in proximity to and along the fourth edge 1244d.

Figure 9A:
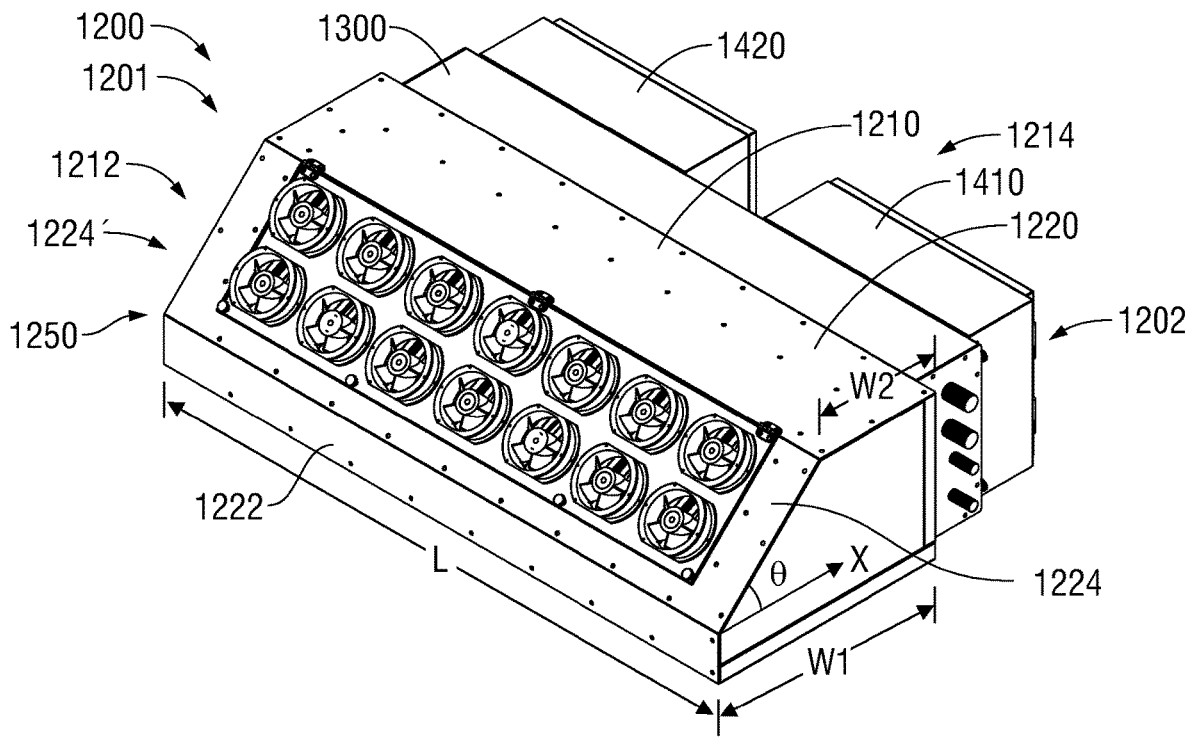
FIG. 9A is a perspective view of one embodiment of a cooling sub-assembly according to the present disclosure that is in thermal communication with the hot space as viewed from an upper vantage point.
Figure 9B:
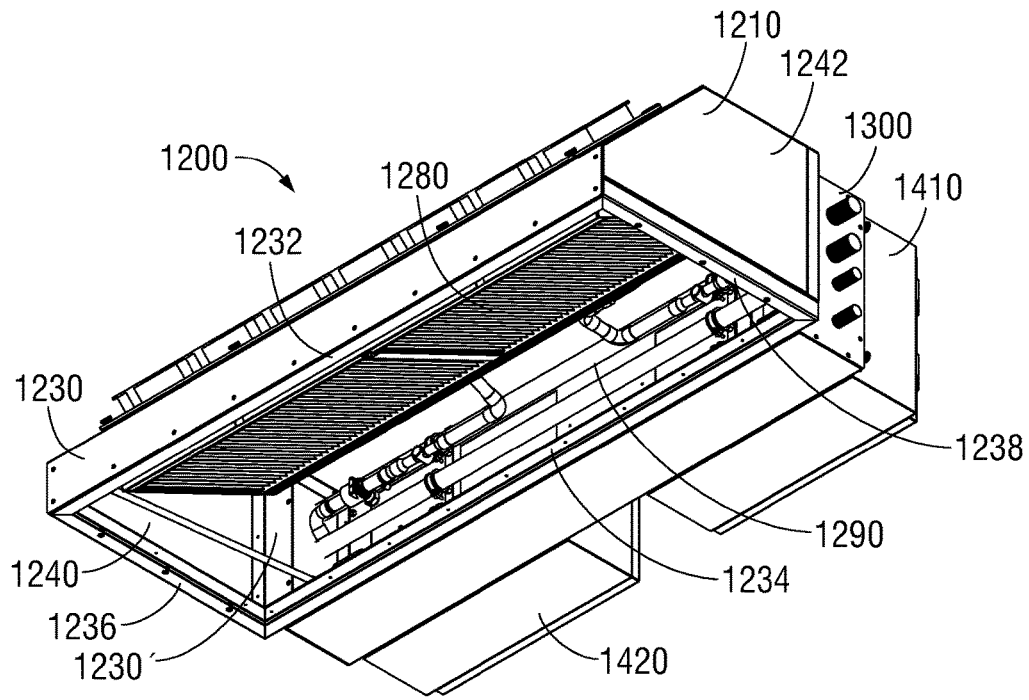
FIG. 9B is a perspective view of the cooling sub-assembly of FIG. 9A as viewed from a lower vantage point.
Figure 9C:
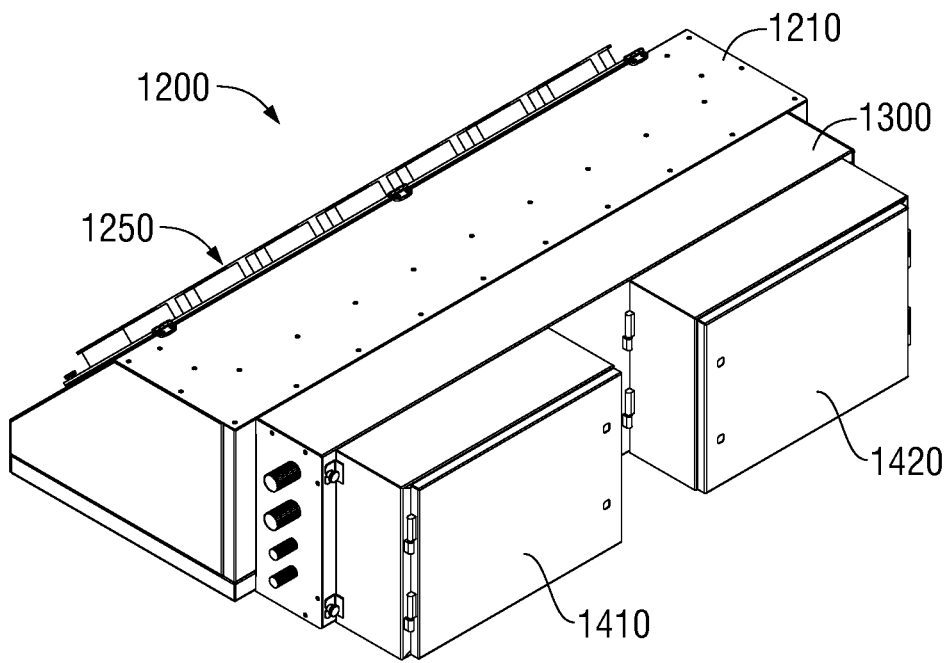
FIG. 9C is another perspective view of the cooling sub-assembly of FIG. 9A as viewed from another upper vantage point.
Figure 9D:
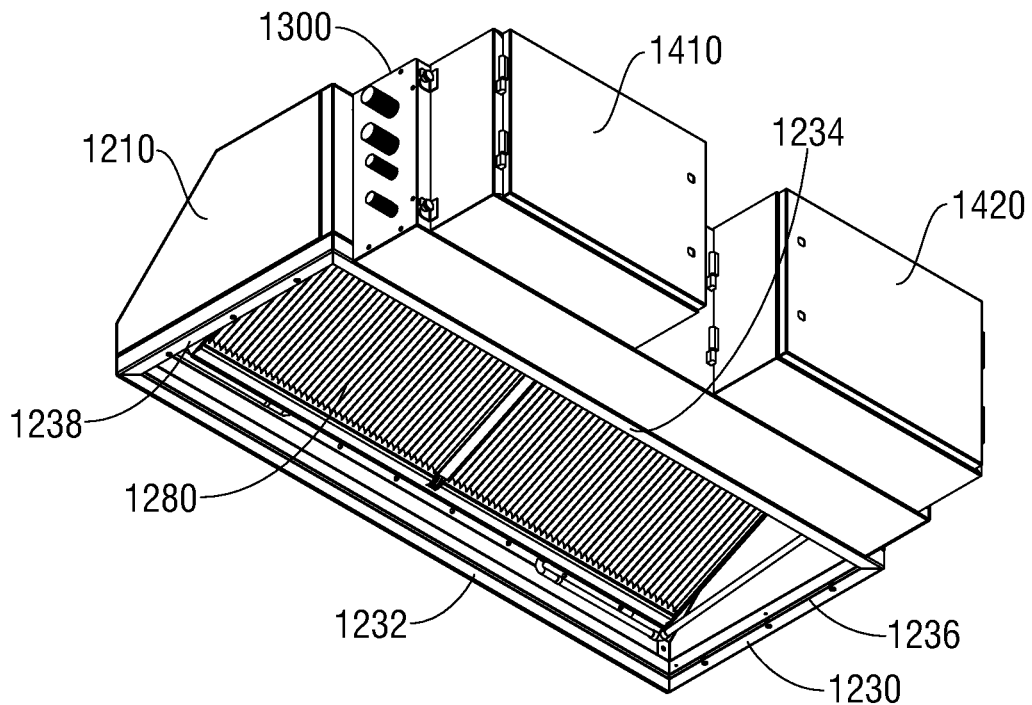
FIG. 9D is another perspective view of the cooling sub-assembly of FIG. 9A as viewed from another lower vantage point.

As best illustrated in FIG. 14, the configuration of the first and second heat exchange support members 1242 and 1244 enable the first and second heat exchangers 1270 and 1280 to be mounted at an angle Φ with respect to the upper edge surface member 1220 (or with respect to the horizontal direction X illustrated in FIG. 9A or FIG. 14) to define a slope of the first and second heat exchangers 1270 and 1280. The angle Φ may be generally midway between the angle Θ that defines the slope of the forced-convection receiving member 1224.

As can be appreciated from the foregoing, the upper supporting frame member 1210 defines a longitudinal dimension L and an upper width dimension W2 of the upper edge surface member 1220, while the lower frame member 1230 defines a lower width dimension W1 which is greater than W2.

The chassis 1200 may further include a fluid section 1300 having a rectangular configuration that is designed to interface with the second frame member assembly 1260 and extends distally towards the distal portion 1214. Upper longitudinal frame member 1302 and lower longitudinal frame member 1304 of fluid section 1300 interface with upper longitudinal frame member 1262 and a lower longitudinal frame member 1264 of the second frame member assembly 1260, respectively.

Similarly, first lateral frame member 1306 and second lateral frame member 1308 of fluid section 1300 are disposed respectively at first end 1201 and second end 1202 and interconnect with upper longitudinal frame member 1302 and lower longitudinal frame member 1304, respectively, at the opposing ends 1201 and 1202 of the upper longitudinal frame member 1302 and lower longitudinal frame member 1304 to define a rectangularly-shaped opening 1300' that interfaces with aperture 1260' of the second frame member 1260.

Fluid section 1300 includes a first refrigerant fluid supply header 1310 and a first refrigerant fluid return header 1320 that extend longitudinally in the rectangularly-shaped opening 1300' to and from the first and second ends 1201 and 1202, respectively.

Additionally, fluid section 1300 also includes a second refrigerant fluid supply header 1330 and a second refrigerant fluid return header 1340 that extend longitudinally in the rectangularly-shaped opening 1300' to and from the first and second ends 1201 and 1202, respectively.

The first and second refrigerant fluid supply headers 1310 and 1330 and first and second refrigerant fluid return headers 1320 and 1340 penetrate through and are supported by the second lateral frame member 1308 at the second end 1202. As additional cooling sub-assemblies or chassis 1200 are added to the data center to form a chain of cooling sub-assemblies or chassis 1200, first and second refrigerant fluid supply headers 1310 and 1330 and first and second refrigerant fluid return headers 1320 and 1340 may be extended in a continual or series configuration to penetrate through and to be supported by the first lateral frame member 1306 at the first end 1201.

A first refrigerant fluid supply branch connection 1350 taps off the first refrigerant fluid supply header 1310 to form a refrigerant supply connection end 1352 which is fluidly coupled to refrigerant fluid inlet supply connection 1272 of the first heat exchanger 1270. As the refrigerant fluid removes heat from air originating in the hot space(s) 1150a, 1150b ... 1150n, the heated refrigerant fluid is discharged from the first heat exchanger 1270 via refrigerant fluid outlet return connection 1274, which in turn is fluidly coupled at first refrigerant return connection 1374 to first refrigerant fluid return branch connection 1370 that taps off the first refrigerant fluid return header 1320.

Similarly, second refrigerant fluid supply branch connection 1360 taps off the second refrigerant fluid supply header 1330 to form a refrigerant supply connection end 1362 which is fluidly coupled to refrigerant fluid inlet supply connection 1282 of the second heat exchanger 1280. Again, as the refrigerant fluid removes heat from air originating in the hot space(s) 1150a, 1150b ... 1150n, the heated refrigerant fluid is discharged from the second heat exchanger 1280 via refrigerant fluid outlet return connection 1284, which in turn is fluidly coupled at second refrigerant return connection 1384 to second refrigerant fluid return branch connection 1380 that taps off the second refrigerant fluid return header 1340.

Thus, the first heat exchanger 1270 and the second heat exchanger 1280 are fluidically independent of one another with respect to the flow of refrigerant fluid. However, the first heat exchanger 1270 and the second heat exchanger 1280 are fluidically in series with one another with respect to the air flow passing across the coils that originates from the hot space(s) 1150a, 1150b ... 1150n.

The chassis 1200 may further include further include a first control box 1410 that is coupled to the distal side of the fluid section 1300 via hinges 1412 and may further include further include a second control box 1420 that is coupled to the distal side of the fluid section 1300 via hinges 1422. The control boxes 1410 and 1420 may be rotatably coupled to the distal side of the fluid section 1300 to facilitate maintenance operations. The control boxes may contain instrumentation and control circuits and power cabling for the forced convection members 1250. Thus the fluid section(s) 1300 may also provide functionality as electrical sections.

Figure 11:
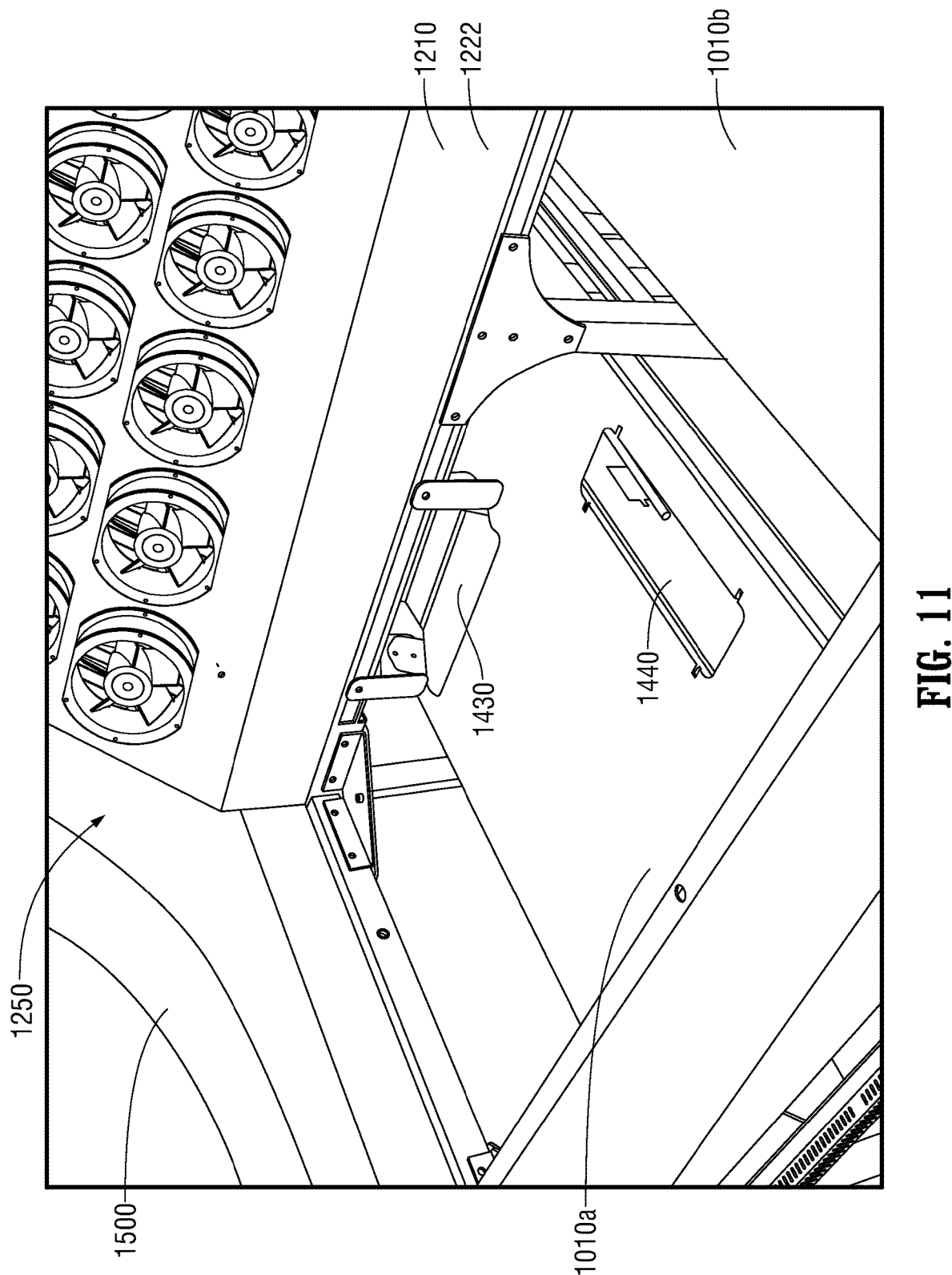
FIG. 11 is a partial perspective view the cooling sub-assembly mounted above the server rack enclosure sub-assembly.

FIG. 11 partially illustrates the forced convection members 1250 in the cooling sub-assembly or chassis 1200 as mounted above a server rack enclosure 1010*a*. Penetration spaces 1430 and 1440 for power or instrumentation and control cabling are positioned below the upper supporting frame member 1210.

Figure 3A:
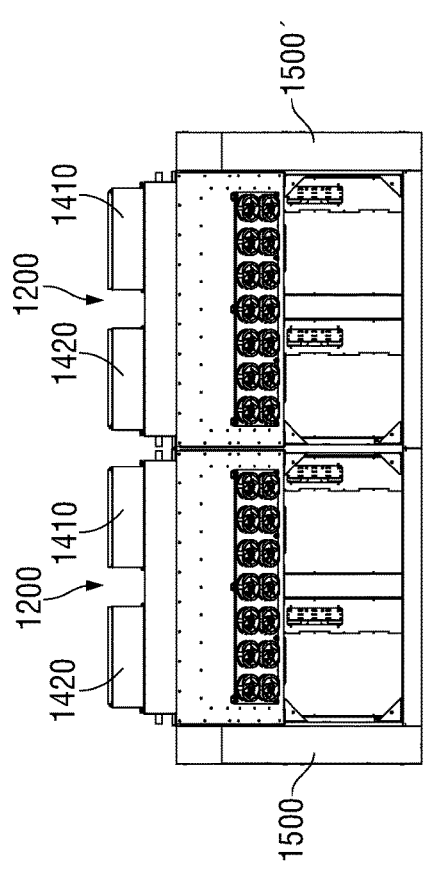
FIG. 3A is a plan view of the cooling assembly of FIG. 1.
Figure 3B:
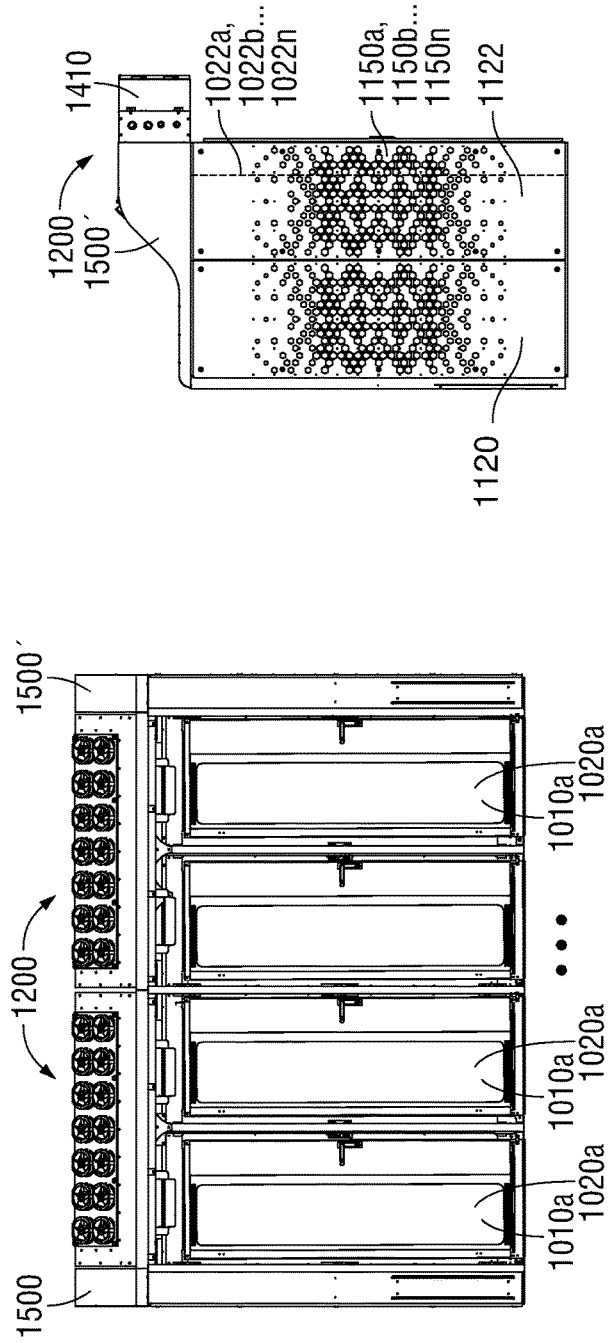
FIG. 3B is an elevation view of the cooling assembly of FIG. 1 and FIG. 3A as viewed from the frontal position.
Figure 12A:
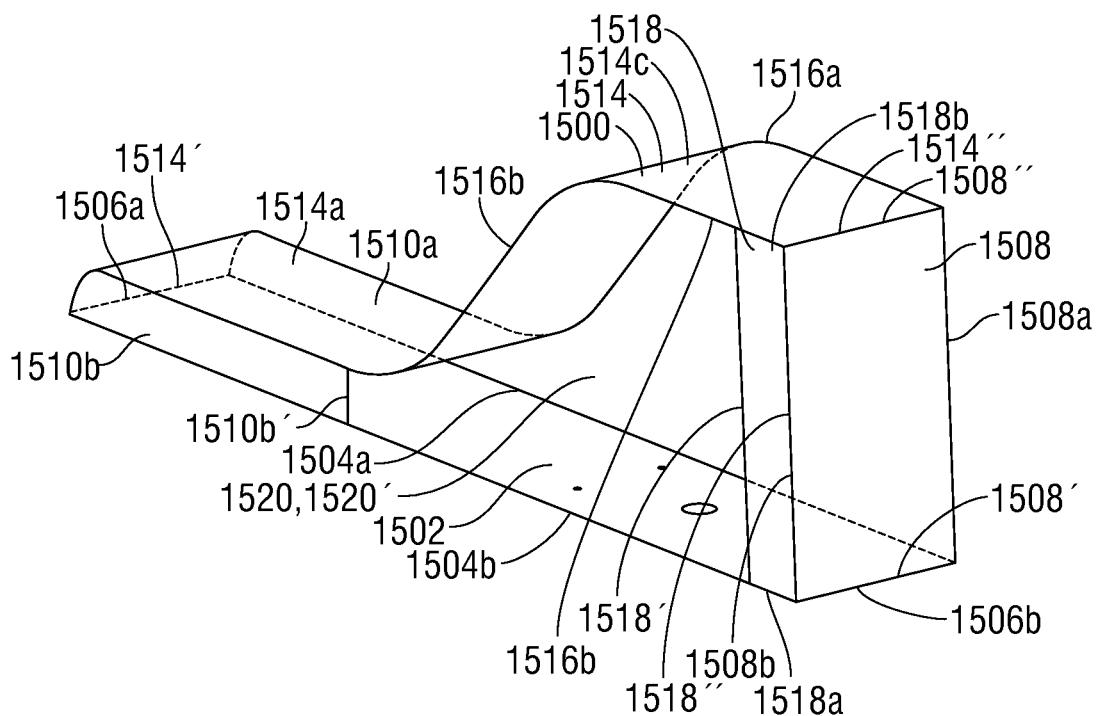
FIG. 12A is a perspective view of one embodiment of a shroud member according to the present disclosure that is operably coupled to the cooling assembly.
Figure 12B:
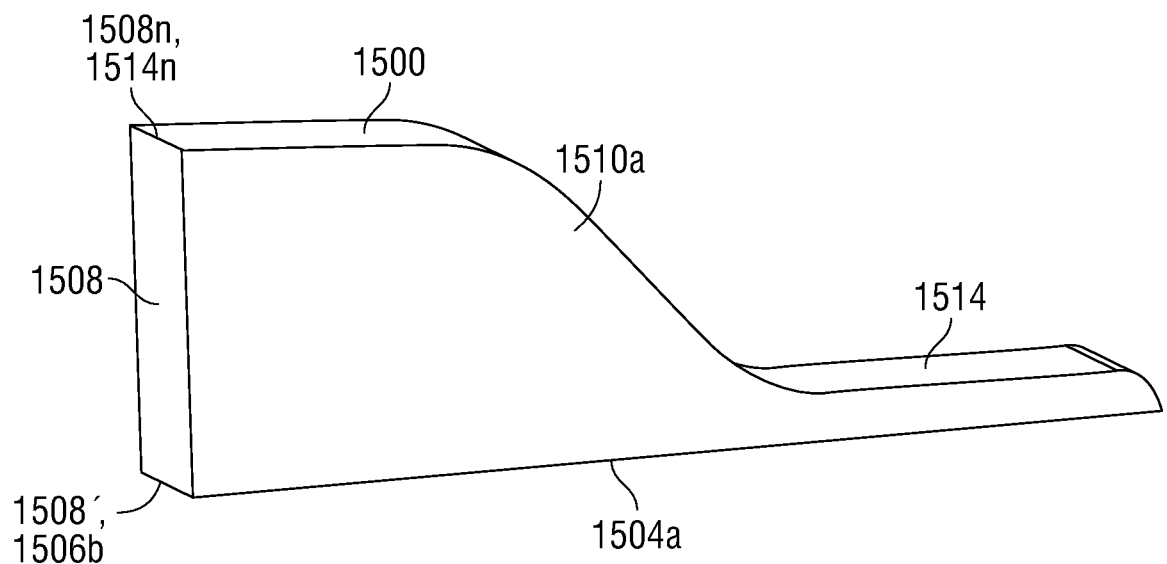
FIG. 12B is another perspective view of the shroud member of FIG. 12A.

FIGS. 12A and 12B illustrate a shroud member 1500 that is configured to be positioned at the first end 1201 and aligned with the cooling assembly or chassis 1200 as particularly illustrated in FIGS. 1, 2 and 11. Shroud member 1500 is also illustrated in FIGS. 3A, 3B and 3C. A mirror image shroud member 1500' (see FIGS. 3A, 3B, 3C; partially shown in FIG. 1) similarly may be configured to be positioned at the second end 1202 and aligned with the cooling sub-assembly or chassis 1200.

The shroud 1500 includes a rectangularly-shaped lower base plate member 1502 having first and second longitudinal edges 1504*a* and 1504*b* and first and second lateral edges or ends 1506*a* and 1506*b*, respectively. A rectangularly-shaped plate member 1508 defines a first lateral edge 1508' that is disposed to interface with the second lateral edge 1506*b* of the lower base plate member 1502. A second lateral edge 1508" extends vertically upward at a right angle to the plate member 1502. In addition, the rectangularly-shaped plate member 1508 defines a first longitudinal edge 1508*a* and a second longitudinal edge 1508*b* each extending vertically upward.

A contoured S-shaped or slide shaped longitudinal panel member 1514 defines a first lateral edge 1514' that intersects with the first lateral edge 1506*a* of the plate member 1502. The panel member 1514 includes a first partially curved horizontal portion 1514*a* defining the first lateral edge 1514', an intermediate portion 1514*b* that slopes upwardly, and a second partially curved horizontal portion 1514*c* that defines a second lateral edge 1514".

Thus, the longitudinal panel member 1514 slopes upwardly such that the second lateral edge 1514" intersects with second lateral edge 1508" of the rectangularly-shaped plate member 1508. As a result, the second lateral edge 1514" is at an elevated position as compared to the first lateral edge 1514'

A contour-matching vertical plate member 1510*a* extends vertically from the first longitudinal edge 1504*a* of the lower plate member 1502 to intersect first longitudinal edge 1516*a* of the panel member 1514.

A first partially contour-matching vertical plate member 1510*b* extends vertically from the second longitudinal edge 1504*b* of the lower plate member 1502 to intersect with second longitudinal edge 1516*b* of the panel member 1514. The vertical plate member 1510*b* extends along the length of first partially curved horizontal portion 1514*a* to a lateral edge 1510*b*′.

A second vertical plate member 1518 defines a first longitudinal edge 1518' and a second longitudinal edge 1518" that intersects at a right angle with the second longitudinal edge 1508*b* of the rectangularly-shaped plate member 1508.

The second vertical plate member 1518 also defines a first lateral edge 1518*a* that intersects with a portion of the second longitudinal edge 1504*b* of the lower plate member 1502 and a second lateral edge 1518*b* that intersects with a portion of the second longitudinal edge 1514*b* of the longitudinal panel member 1514.

Thus the lateral edge 1510*b*′ of the first partially contoured plate 1510*b*, the second longitudinal edge 1516*b* of the longitudinal panel member 1514 that extends along the intermediate portion 1514*b* and partially along the second partially curved horizontal portion 1514*c*, the first longitudinal edge 1518' and a portion of the second longitudinal edge 1504*b* of the lower panel member 1502 that extends from the lateral edge 1510*b*′ to the first longitudinal edge 1518' define an aperture 1520 of an internal volume 1520' defined within the shroud member 1500.

FIG. 13, as previously described, illustrates the cooling sub-assemblies or chassis 1200 mounted above the server rack enclosure sub-assemblies 1100.

FIG. 14 is a cross-sectional view of one of the cooling assemblies 1000 to illustrate the flow of heated air in the direction of arrow A from the servers (not shown) in the server racks (not shown) as the heated air enters the hot space(s) 1150*a*, 1150*b* . . . 1150*n* and is drawn upward as shown by the arrow B to the suction side of the forced convection members 1250 first passing through the first and second coil heat exchangers 1270 and 1280, respectively where the air is cooled and heat is removed and discharged to the refrigerant circuit as described above with respect to the cooling sub-assemblies or chassis 1200. As illustrated by arrows C, the air is discharged from the forced convection members 1250 and circulates downwardly in the direction of the arrows D to return as cold air entering the server racks to again cool the servers.

Thus, those skilled in the art will recognize and understand that the aforementioned components of chassis 1200 define structure that is configured to receive at least one heat exchange member, e.g., first and second heat exchangers 1270 and 1280, that exchange heat between a refrigerant fluid flowing through the one or more heat exchange members 1270 and 1280 and heated air or gas that removes heat from at least one server and (not shown) which flows through the confined hot space(s) 1150*a*, 1150*b* . . . 1150*n*.

Figure 15:
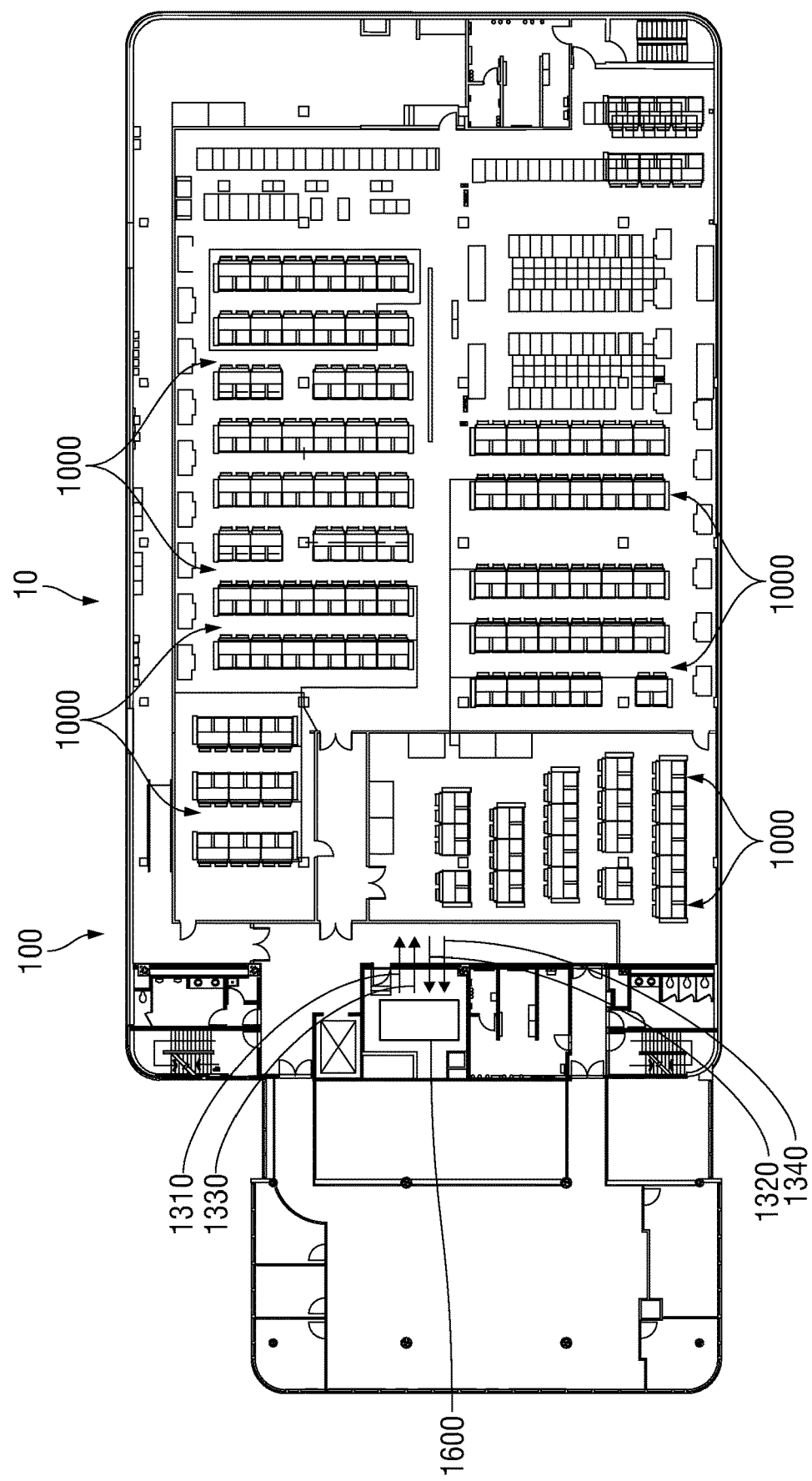
FIG. 15 is a schematic diagram of a cooling system for cooling server racks that includes a plurality of cooling assemblies and a central cooling circuit according to one embodiment of the present disclosure.

FIG. 15 is a schematic diagram of a cooling system 100 for cooling server racks in a data center 10 that includes a plurality of cooling assemblies 1000 and a central cooling circuit 1600 according to one embodiment of the present disclosure. The central cooling circuit 1600 is fluidically coupled to the first refrigerant fluid supply header 1310 and first refrigerant fluid return header 1320 and to the second refrigerant fluid supply header 1330 and second refrigerant fluid return header 1340 of the fluid sections 1300 (see FIGS. 9A, 9B, 9C, 9D and 10) that may be extended throughout the data center 10.

The central cooling circuit 1600 is configured to enable independent refrigerant flow and temperature control to the first refrigerant fluid supply header 1310 and first refrigerant fluid return header 1320 and to the second refrigerant fluid supply header 1330 and second refrigerant fluid return header 1340. The central cooling circuit 1600 may include, but is not limited to, the dual cooling systems described in international application publication WO 2011/16532 A1 "SPACE-SAVING HIGH-DENSITY MODULAR DATA CENTER AND ENERGY-EFFICIENT COOLING SYSTEM" by Keisling et al. and in international application publication WO 2012/118553 A1 "SPACE-SAVING HIGH-DENSITY MODULAR DATA POD SYSTEMS AND ENERGY-EFFICIENT COOLING SYSTEMS" by Keisling et al. The entire contents of both of these applications are incorporated herein by reference. Regardless of the type of central cooling circuit 1600, the cooling capacity of the central cooling circuit 1600 is adjustable when the cooling load is increased as additional cooling assemblies 1000 are deployed within the data center.

Figure 16A:
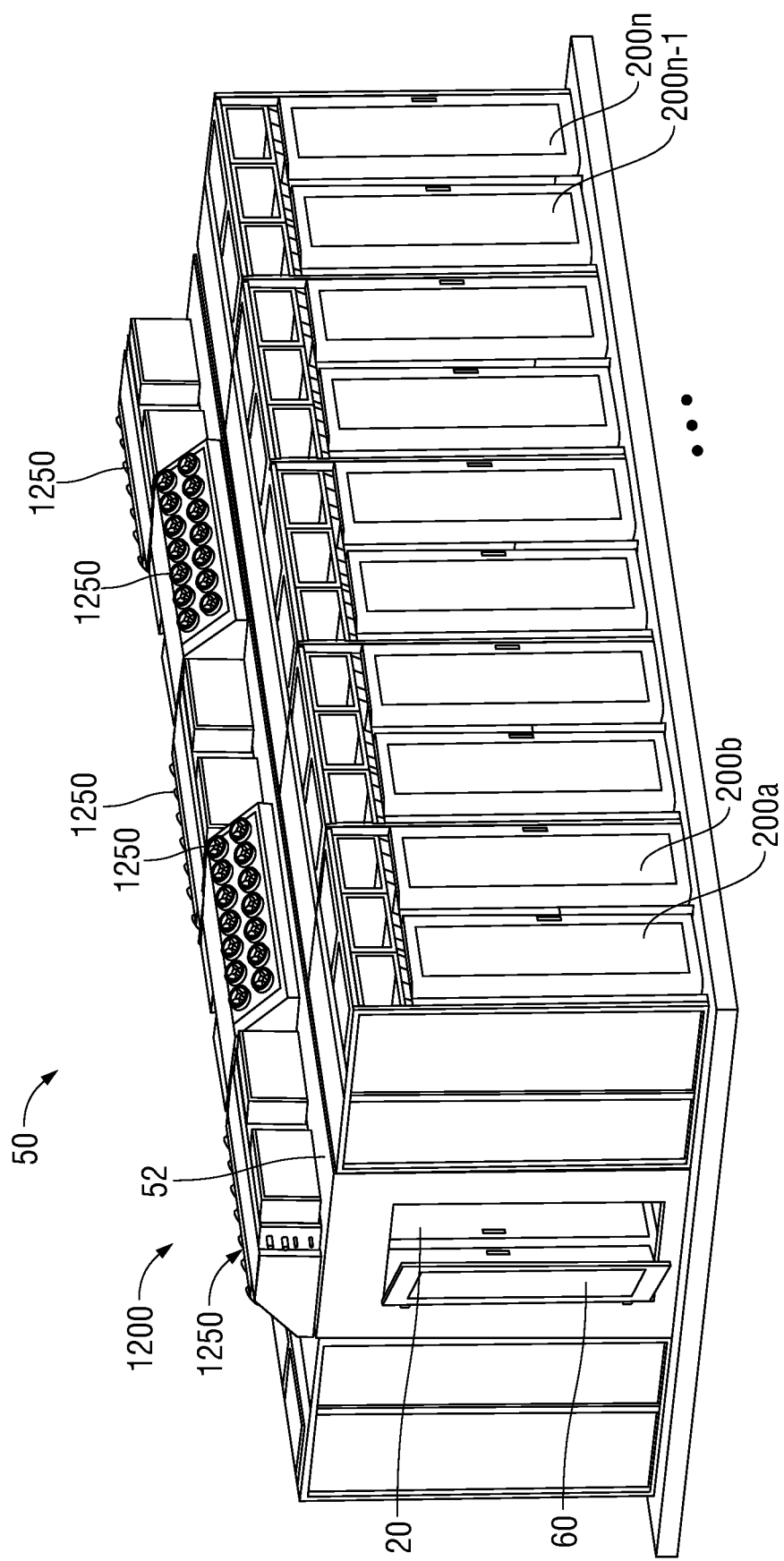
FIG. 16A is a perspective view of a plurality of cooling sub-assemblies for cooling servers in server racks according to another embodiment of the present disclosure.
Figure 16B:
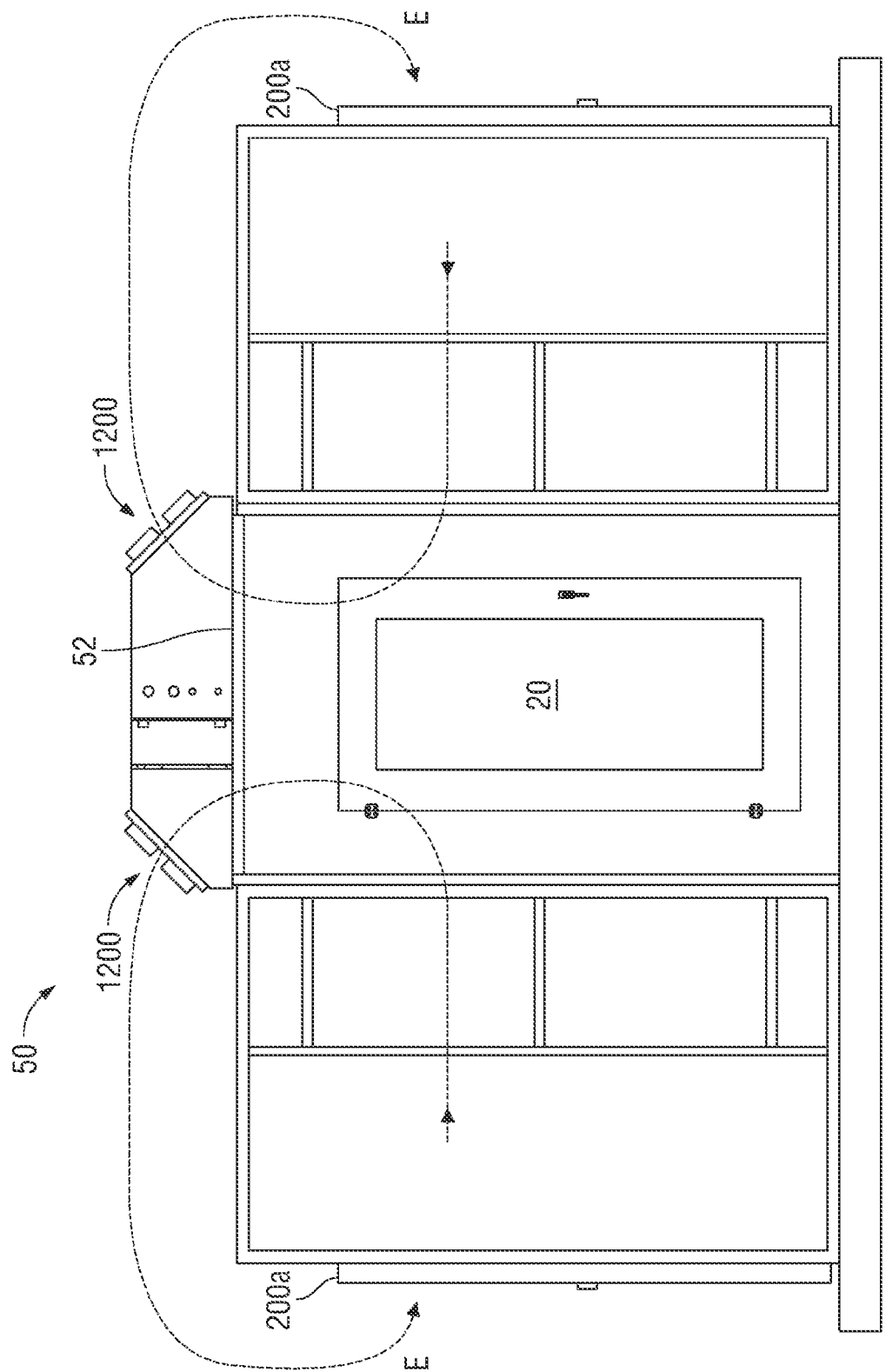
FIG. 16B is an elevation end view of the plurality of cooling sub-assemblies of FIG. 16A.

FIG. 16A is a perspective view of a plurality of cooling sub-assemblies 1200 for cooling servers in server racks according to another embodiment of the present disclosure. FIG. 16B is an elevation end view of the plurality of cooling sub-assemblies 1200 of FIG. 16A and FIG. 16C is an elevation view of the plurality of cooling sub-assemblies 1200 of FIGS. 16A and 16B.

More particularly, FIG. 16A illustrates an existing data center 50 having a central ceiling 52 mounted above a hot aisle 20. The data center 50 includes a plurality of existing servers in existing server rack enclosures 200a, 200b . . . 200n-1, 200n.

Openings, which are not directly visible, are formed in the central hot aisle ceiling 52 to enable the cooling sub-assemblies 1200 to be mounted in the openings to interface with the lower rectangularly-shaped openings 1230' of the rectangular lower perimeter frame members 1230, thereby enabling circulation of cooling air through the existing data enclosures 200a, 200b . . . , 200n-1, 200n by operation of the cooling assemblies in a similar manner as described above with respect to FIG. 14.

Figure 16C:
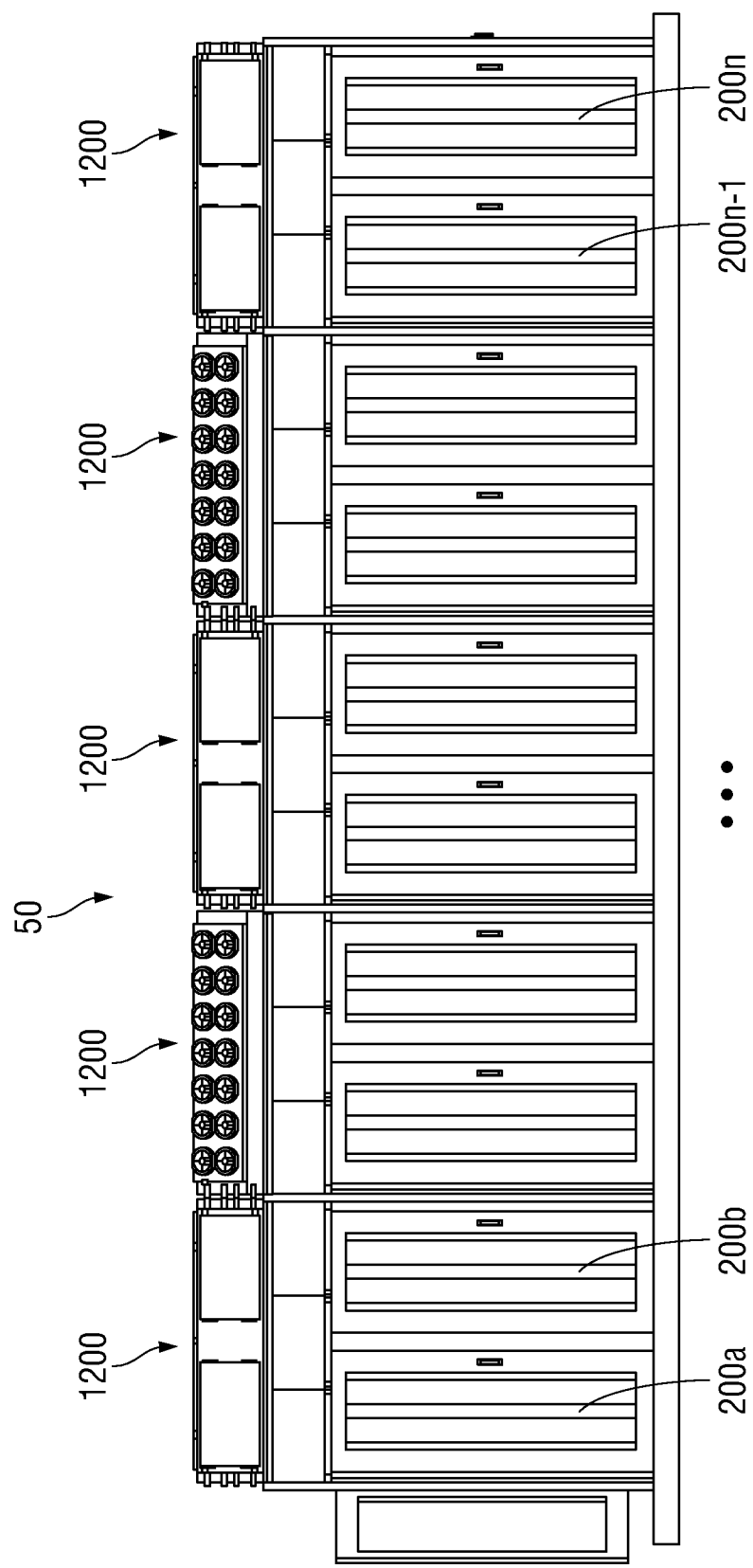
FIG. 16C is an elevation view of the plurality of cooling sub-assemblies of FIGS. 16A and 16B.

As best illustrated in FIGS. 16A and 16C, the cooling sub-assemblies 1200 are mounted in the central hot aisle ceiling 52 in an alternating pattern such that the pluralities of forced convection members 1250 alternately face to the right side of the hot aisle 20 and the left side hot aisle 20.

As illustrated in FIG. 16B, hot air flows into the hot aisle 20 and upwardly through the alternating cooling sub-assemblies 1200 to be forced through the heat exchangers 1270 and 1280 (see FIG. 10) and is recirculated back to the plurality of existing servers in existing server rack enclosures 200a, 200b . . . 200n-1, 200n as shown by the arrows E.

Thus, the cooling sub-assemblies 1200 may be easily retrofitted into existing data centers, in conjunction with the installation of the central cooling circuit 1600 to form a cooling system analogous to cooling system 100 for cooling server racks as described above with respect to FIG. 15.

Accordingly, the energy consumption and power cost expenditures for existing data centers may be substantially reduced by the embodiments of the present disclosure.

While several embodiments of the disclosure have been shown in the drawings and/or described in the specification, it is not intended that the disclosure be limited to these embodiments. It is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims set forth below.

What is claimed is:

1. A system for cooling server racks comprising:
a first row of server rack enclosure sub-assemblies, the first row of server rack enclosure sub-assemblies including a plurality of first server rack enclosure sub-assemblies configured to receive at least one first server rack configured to support at least one first server, the first row of server rack enclosure sub-assemblies defining a front portion with respect to the at least one first server rack and a rear portion with respect to the at least one first server rack;
a second row of server rack enclosure sub-assemblies, the second row of server rack enclosure sub-assemblies including a plurality of second server rack enclosure sub-assemblies configured to receive at least one second server rack configured to support at least one second server, the second row of server rack enclosure sub-assemblies defining a front portion with respect to the at least one second server rack and a rear portion with respect to the at least one second server rack, the rear portion of the second row of server rack enclosure sub-assemblies facing the rear portion of the first row of server rack enclosure sub-assemblies and disposed in spaced relation to one another;
a central ceiling coupled to the rear portion of the second row of server rack enclosure sub-assemblies and the rear portion of the first row of server rack enclosure sub-assemblies and extending therebetween, the central ceiling, the first row of server rack enclosure sub-assemblies, and the second row of server rack enclosure sub-assemblies defining a confined hot aisle;
a first cooling sub-assembly disposed above the central ceiling and in thermal communication with the confined hot aisle, the first cooling sub-assembly comprising a structure configured to receive at least one first heat exchange member for exchanging heat between a first fluid flowing through the at least one first heat exchange member and a second fluid that removes the heat from the a first pair of the at least one first server rack of the first row of server rack enclosure sub-assemblies and the at least one second server rack of the second row of server rack enclosure sub-assemblies, and which flows through the confined hot aisle, the at least one first heat exchanger member offset from a central portion of the central ceiling towards one of the at least one first server rack and the at least one second server rack of the first pair of the at least one first server rack and the at least one second server rack, wherein the first cooling sub-assembly includes a first forced convection member operably coupled thereto and in fluid communication with the confined hot aisle, the first forced convection member disposed adjacent to the one of the first server rack enclosure sub-assembly and the second server rack enclosure sub-assembly of the first pair of the at least one first server rack and the at least one second server rack, wherein the first second fluid flows through the confined hot aisle, through the at least one first heat exchange member, and out of the above the central ceiling, wherein the first cooling sub-assembly includes a first fluid section in fluid communication with the at least one first heat exchange member, the first fluid section disposed at the central portion of the central ceiling such that the at least one first heat exchange member is disposed adjacent to the first fluid section;
a second cooling sub-assembly disposed above the central ceiling between a second pair of the at least one first server rack and the at least one second server rack and in thermal communication with the confined hot aisle, the second cooling sub-assembly disposed adjacent to the first cooling sub-assembly and including a second forced convection member operably coupled thereto and in fluid communication with the confined hot aisle, the second forced convection member disposed in juxtaposed relation to the first forced convection member such that the second forced convection member is disposed adjacent to an opposite one of the first row of server rack enclosure sub-assemblies and the second row of server rack enclosure sub-assemblies adjacent to where the first forced convection member is disposed such that the first and second forced convection members are disposed in an alternating fashion along a length of the first and second rows of server rack enclosure sub-assemblies; and a central cooling circuit in thermal communication with the at least one first heat exchange member of the first cooling sub-assembly, the central cooling circuit configured to remove the heat transferred to the first fluid.

2. The system according to claim 1, wherein the first fluid is a refrigerant and the second fluid is air or a gas.

3. The system according to claim 1, wherein the structure of the first cooling sub-assembly comprises a set of frame members configured and disposed to retain the at least one first heat exchange member, the set of frame members supporting the at least one first heat exchange member to enable the thermal communication with the confined hot aisle for cooling of the first pair of the at least one first server rack and the at least one second server rack.

4. The system according to claim 3, wherein the set of frame members is configured and disposed to support at least one refrigerant fluid supply line and at least one refrigerant fluid return line, the at least one first heat exchange member in fluid and thermal communication with the central cooling circuit via the at least one refrigerant fluid supply line and the at least one refrigerant fluid return line.

5. The system according to claim 3, wherein the set of frame members is configured and disposed to support the first forced convection cooling member in fluid communication with the at least one first heat exchange member to enable the cooling of the first pair of the at least one first server rack and the at least one second server rack.

6. The system according to claim 3, wherein the second cooling sub-assembly includes a structure configured to receive at least one second heat exchange member for exchanging heat between the first fluid flowing through the at least one second heat exchange member and the second fluid that flows through the confined hot aisle and removes the heat from the second pair of the at least one first server rack of the first row of server rack enclosure sub-assemblies and the at least one second server rack of the second row of server rack enclosure sub-assemblies.

7. The system according to claim 6, wherein the second cooling sub-assembly comprises a second fluid section configured to enable fluid and thermal communication with the at least one second heat exchange member, the first and second fluid sections each defining a first fluid section end and a second fluid section end, each of the first and second fluid section ends enabling the thermal communication, the first fluid section end of the second fluid section of the second cooling sub-assembly configured to couple in series with the second fluid section end of the first fluid section of the first cooling sub-assembly to form a chain of cooling sub-assemblies.

8. The system according to claim 7, wherein the first fluid section further defines a first electrical section and the second fluid section further defines a second electrical section, the first electrical section and the second electrical section each having a first electrical section end and a second electrical section end, the first electrical section end of the second electrical section configured to enable electrical communication with the second electrical section end of the first electrical section.

9. The system according to claim 6, wherein the at least one second heat exchange member is disposed on an opposite side of the central portion of the central ceiling compared to the at least one first heat exchange member.

10. The system according to claim 6, wherein the second cooling sub-assembly includes a second fluid section in fluid communication with the at least one second heat exchange member, the first and second fluid sections disposed at the central portion of the central ceiling between the second pair of the at least one first server rack and the at least one second server rack such that the at least one first heat exchange member is disposed adjacent to the first fluid section, the at least one second heat exchange member is disposed adjacent the second fluid section, and the at least one second heat exchange member is offset from the central portion of the central ceiling towards an opposite one of the at least one first server rack and the at least one second server rack of the first pair of at least one first server rack and the at least one second server rack, adjacent to where the at least one first heat exchange member is disposed such that the at least one first heat exchange member and the at least one second heat exchange member are disposed in an alternating fashion.

11. A system for cooling server racks comprising:

a first row of server rack enclosure sub-assemblies, the first row of server rack enclosure sub-assemblies including a plurality of first server rack enclosure sub-assemblies configured to receive at least one first server rack configured to support at least one first server, the first row of server rack enclosure sub-assemblies defining a front portion with respect to the at least one first server rack and a rear portion with respect to the at least one first server rack;

a second row of server rack enclosure sub-assemblies, the second row of server rack enclosure sub-assemblies including a plurality of second server rack enclosure sub-assemblies configured to receive at least one second server rack configured to support at least one second server, the second row of server rack enclosure sub-assemblies defining a front portion with respect to the at least one second server rack and a rear portion with respect to the at least one second server rack, the rear portion of the second row of server rack enclosure sub-assemblies facing the rear portion of the first row of server rack enclosure sub-assemblies and disposed in spaced relation to one another; a central ceiling coupled to the rear portion of the second row of server rack enclosure sub-assemblies and the rear portion of the first row of server rack enclosure sub-assemblies and extending therebetween, the central ceiling, the first row of server rack enclosure sub-assemblies, and the second row of server rack enclosure sub-assemblies defining a confined hot aisle;

a first cooling sub-assembly disposed above the central ceiling and in thermal communication with the confined hot aisle, the first cooling sub-assembly comprising a structure configured to receive at least one first heat exchange member for exchanging heat between a first fluid flowing through the at least one first heat exchange member and a second fluid flowing through the confined hot aisle and removes the heat from the first and second server racks of the first and second rows of server rack enclosure sub-assemblies, respectively, the at least one first heat exchanger member offset from a central portion of the central ceiling towards one of the at least one first server rack and the at least one second server rack of a first pair of at least one first server rack and at least one second server rack, wherein the first cooling sub-assembly includes a first forced convection member operably coupled thereto and in fluid communication with the confined hot aisle, the first forced convection member disposed adjacent to one of the first row of server rack enclosure sub-assemblies and the second row of server rack enclosure sub-assemblies, wherein the first second fluid flows through the confined hot aisle, through the at least one first heat exchange member, and out of the confined hot above the central ceiling;

a second cooling sub-assembly disposed above the central ceiling between a second pair of the at least one first server rack and the at least one second server rack and in thermal communication with the confined hot aisle, the second cooling sub-assembly disposed adjacent to the first cooling sub-assembly and including a second forced convection member operably coupled thereto and in fluid communication with the confined hot aisle, the second forced convection member disposed in juxtaposed relation to the first forced convection member such that the second forced convection member is disposed adjacent towards an opposite one of the first row of server rack enclosure sub-assemblies and the second row of server rack enclosure sub-assemblies to which the first forced convection member is disposed such that the first and second forced convection members are disposed in an alternating fashion along a length of the first and second rows of server rack enclosure sub-assemblies; and a central cooling circuit in thermal communication with the at least one first heat exchange member of the first cooling sub-assembly, the central cooling circuit configured to remove the heat transferred to the first fluid, wherein the structure of the first cooling sub-assembly comprises a set of frame members configured and disposed to retain the at least one first heat exchange member, the set of frame members supporting the at least one first heat exchange member to enable the thermal communication with the confined hot aisle for cooling of the first pair of the at least one first server rack and the at least one second server rack, wherein the second cooling sub-assembly includes a structure configured to receive at least one second heat exchange member for exchanging heat between the first fluid flowing through the at least one second heat exchange member and the second fluid that flows through the confined hot aisle and removes the heat from the second pair of the at least one first server rack and the at least one second server rack, and wherein the first cooling sub-assembly includes a first fluid section in fluid communication with the at least one first heat exchange member, the second cooling sub-assembly includes a second fluid section in fluid communication with the at least one second heat exchange member, the first and second fluid sections disposed at the central portion of the central ceiling such that the at least one first heat exchange member is disposed adjacent to the first fluid section, the at least one second heat exchange member is disposed adjacent the second fluid section, and the at least one second heat exchange member is offset from the central portion of the central ceiling towards the opposite one of the at least one first server rack and the at least one second server rack of the first pair of at least one first and second server racks adjacent to where the at least one first heat exchange member is disposed such that the at least one first heat exchange member and the at least one second heat exchange member are disposed in an alternating fashion.

* * * * *